US012660338B2

(12) United States Patent
Nara

(10) Patent No.: US 12,660,338 B2
(45) Date of Patent: Jun. 16, 2026

(54) PHOTODIODE ARRAY AND IMAGE SENSOR

(71) Applicant: TIANMA JAPAN, LTD., Kawasaki (JP)

(72) Inventor: Shuhei Nara, Kawasaki (JP)

(73) Assignee: TIANMA JAPAN, LTD., Kanagawa (JP)

( * ) Notice: Subject to any disclaimer, the term of this patent is extended or adjusted under 35 U.S.C. 154(b) by 686 days.

(21) Appl. No.: 17/721,180

(22) Filed: Apr. 14, 2022

(65) Prior Publication Data

US 2022/0336517 A1 Oct. 20, 2022

(30) Foreign Application Priority Data

Apr. 16, 2021 (JP) .................................. 2021-069804

(51) Int. Cl.
*H10F 39/18* (2025.01)
*H10F 39/00* (2025.01)

(52) U.S. Cl.
CPC ........... *H10F 39/18* (2025.01); *H10F 39/802* (2025.01); *H10F 39/80373* (2025.01); *H10F 39/811* (2025.01)

(58) Field of Classification Search
CPC ....... H01L 2924/12043; H01L 29/6603; H01L 29/6606; H01L 29/6609; H01L 29/66204; H01L 27/14603; H01L 27/14614; H01L 27/14636
See application file for complete search history.

(56) References Cited

U.S. PATENT DOCUMENTS

| | | | |
|---|---|---|---|
| 7,208,742 B1 | 4/2007 | Zelakiewicz et al. | |
| 8,497,562 B2 * | 7/2013 | Ishida ............... | H01L 27/14658 257/E31.124 |
| 8,791,419 B2 * | 7/2014 | Chang ................... | H10F 39/026 250/370.08 |
| 9,698,193 B1 * | 7/2017 | Karim ................. | H01L 31/0216 |
| 2006/0062352 A1 | 3/2006 | Nomura | |
| 2009/0267121 A1 | 10/2009 | Ishida | |

(Continued)

FOREIGN PATENT DOCUMENTS

| | | |
|---|---|---|
| JP | H05102447 A | 4/1993 |
| JP | 2004265934 A | 9/2004 |

(Continued)

OTHER PUBLICATIONS

Office Action, issued in Japanese Patent Application No. 2021-069804 dated Aug. 27, 2024 (concise explanation of the relevance).

*Primary Examiner* — Jeff W Natalini
*Assistant Examiner* — Andrew John Zabel
(74) *Attorney, Agent, or Firm* — NIXON & VANDERHYE

(57) ABSTRACT

A photodiode array includes a plurality of elemental devices arrayed on a substrate. Each of the plurality of elemental devices includes an upper electrode, a lower electrode, a photoelectric conversion region between the upper electrode and the lower electrode, a lower conductive part located lower than the lower electrode; and an insulating layer between the lower electrode and the lower conductive part. The lower conductive part at least partially overlaps the lower electrode with the insulating layer interposed therebetween when viewed planarly.

8 Claims, 25 Drawing Sheets

(56) References Cited

U.S. PATENT DOCUMENTS

| 2011/0266599 | A1 | 11/2011 | Ishida | |
| 2012/0025190 | A1 | 2/2012 | Okada | |
| 2016/0161426 | A1* | 6/2016 | Wober | G01T 1/24 |
| | | | | 378/19 |
| 2016/0316159 | A1 | 10/2016 | Yoneda | |
| 2016/0322416 | A1* | 11/2016 | Nara | H01L 29/78606 |
| 2017/0250214 | A1* | 8/2017 | Sekine | H10D 86/423 |
| 2020/0003911 | A1* | 1/2020 | Nara | G01T 1/2002 |
| 2020/0111824 | A1* | 4/2020 | Sekine | H10B 63/20 |
| 2021/0013251 | A1* | 1/2021 | Takita | H01L 27/14636 |
| 2021/0066385 | A1* | 3/2021 | Misaki | H01L 31/1055 |

FOREIGN PATENT DOCUMENTS

| JP | 2007073724 | A | 3/2007 |
| JP | 2009170646 | A | 7/2009 |
| JP | 2009283896 | A | 12/2009 |
| JP | 2011249370 | A | 12/2011 |

* cited by examiner

PHOTODIODE ARRAY AND IMAGE SENSOR

CROSS-REFERENCE TO RELATED APPLICATIONS

This non-provisional application claims priority under 35 U.S.C. § 119(a) on Patent Application No. 2021-069804 filed in Japan on Apr. 16, 2021, the entire content of which is hereby incorporated by reference.

BACKGROUND

This disclosure relates to a photodiode array.

Flat panel detectors (FPDs) used for image sensors such as X-ray sensors have been improved to exhibit higher precision. The FPDs used for X-ray sensors are generally categorized as a direct conversion type and an indirect conversion type. The indirect conversion type of FPDs include a luminescent material (scintillator) that converts X-rays into light (such as visible light or ultraviolet light) and a photodiode array that converts the light into an electric signal in their X-ray detection panels.

SUMMARY

An aspect of this disclosure is a photodiode array including a plurality of elemental devices arrayed on a substrate. Each of the plurality of elemental devices includes: an upper electrode; a lower electrode; a photoelectric conversion region between the upper electrode and the lower electrode; a lower conductive part located lower than the lower electrode; and an insulating layer between the lower electrode and the lower conductive part. The lower conductive part at least partially overlaps the lower electrode with the insulating layer interposed therebetween when viewed planarly.

It is to be understood that both the foregoing general description and the following detailed description are exemplary and explanatory and are not restrictive of this disclosure.

EMBODIMENTS

Figure 1:
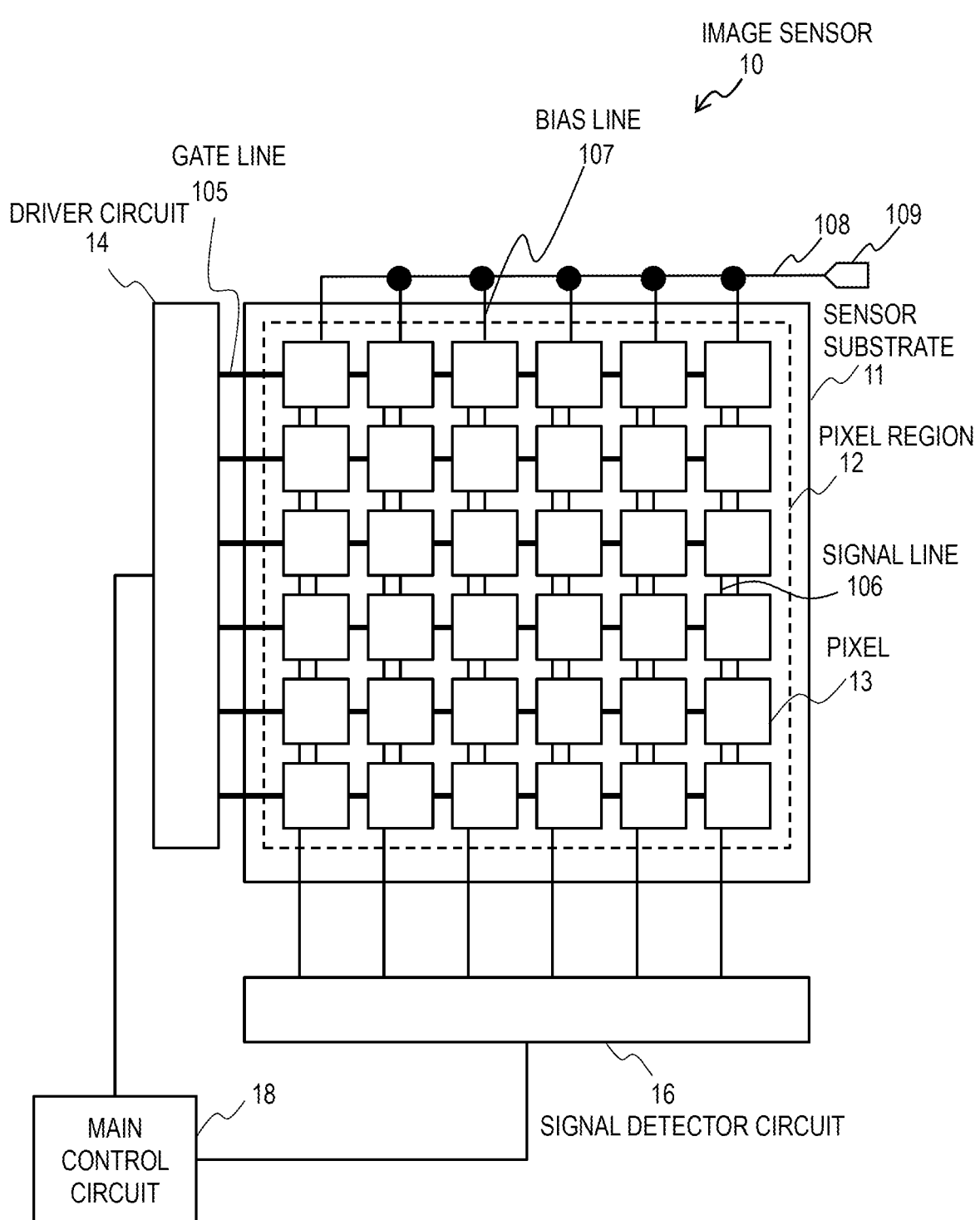
FIG. 1 is a block diagram illustrating a configuration of an image sensor in an embodiment.

Hereinafter, photodiode arrays related to embodiments of this specification are described specifically with reference to the drawings. Those photodiode arrays are applicable to image sensors; however, the configurations of the photodiode arrays of this disclosure are applicable to apparatuses different from image sensors.

The elements in each drawing are changed in size or scale as appropriate to be well recognized in the drawing. The hatches in the drawings are to distinguish the elements and are not to represent cross-sections. The non-linear elements used as switching elements or amplifying elements are referred to as transistors. The transistors include thin-film transistors (TFTs).

A photodiode array in an embodiment of this specification includes a plurality of pixels laid out on a substrate. Each pixel includes a photodiode sandwiched between a lower electrode and an upper electrode and further, a lower conductive part. The lower conductive part is located lower than the lower electrode and an insulating layer is interposed therebetween. The pixel capacitor includes an additional capacitor between the lower electrode and the lower conductive part in addition to a junction capacitor between the lower electrode and the upper electrode. For this reason, the pixel capacitor can have a larger capacitance to improve the pixel characteristics.

The image sensor of this disclosure is applicable to radiographic imaging devices in the fields of medical and industrial non-destructive testing. The light to be detected is electromagnetic rays having an arbitrary frequency, which can be infrared rays, visible light, or X-rays.

Configuration of Image Sensor

FIG. 1 is a block diagram illustrating a configuration example of an image sensor in an embodiment of this specification. The image sensor 10 includes a sensor substrate 11 and control circuits. The control circuits include a driver circuit 14, a signal detector circuit 16, and a main control circuit 18.

The sensor substrate 11 includes an insulating substrate (such as a glass substrate) and a pixel region 12 in which pixels 13 are arrayed horizontally and vertically like a matrix on the insulating substrate. A pixel 13 is an example of an elemental device on the substrate that includes a photodiode. The layout of the pixels 13 is not limited to the matrix layout illustrated in FIG. 1. The pixel region 12 may include scintillator that emits fluorescence in response to radial rays to be detected.

The pixels 13 are disposed at intersections between a plurality of signal lines 106 and a plurality of gate lines (scanning lines) 105. In FIG. 1, the signal lines 106 are disposed to extend vertically and be horizontally distant from one another. The gate lines 105 are disposed to extend horizontally and be vertically distant from one another. Each pixel 13 is connected with a bias line 107. In FIG. 1, bias lines are disposed to extend vertically and be horizontally distant from one another. In FIG. 1, only one of the pixels, one of the signal lines, one of the gate lines, and one of the bias lines are provided with reference signs 13, 106, 105, and 107, respectively.

Each signal line 106 is connected with a different pixel column. Each gate line 105 is connected with a different pixel row. The signal line 106 is connected with the signal detector circuit 16 and the gate line 105 is connected with the driver circuit 14. Each bias line 107 is connected with a common bias line 108. A pad 109 of the common bias line 108 is supplied with a bias potential. The driver circuit 14 drives the gate lines 105 of the pixels 13 to detect light with the pixels 13. The signal detector circuit 16 detects signals from individual signal lines. The main control circuit 18 controls the driver circuit 14 and the signal detector circuit 16.

Circuit Configuration of Pixel

Figure 2:
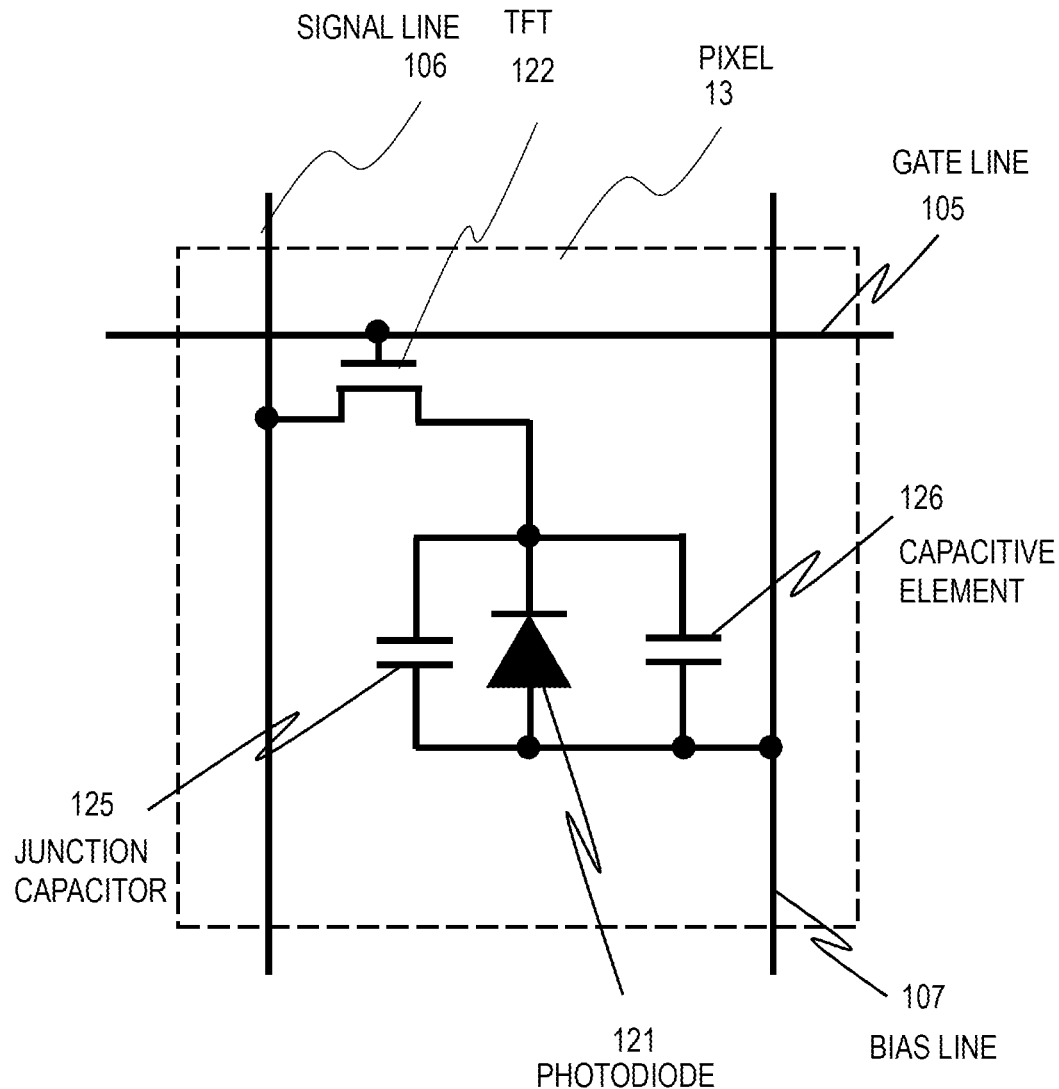
FIG. 2 is a circuit diagram of an equivalent circuit of a pixel of the image sensor in an embodiment.

FIG. 2 is a circuit diagram illustrating an equivalent circuit of one pixel 13. The pixel 13 includes a photodiode 121 as a photoelectric conversion element and a thin-film transistor (TFT) 122 as a switching element. The gate terminal of the thin-film transistor 122 is connected with a gate line 105; one of the source/drain terminals is connected with a signal line 106; and the other source/drain terminal is connected with the cathode terminal of the photodiode 121. In the example of FIG. 2, the anode terminal of the photodiode 121 is connected with a bias line 107.

The thin-film transistor 122 can be an amorphous silicon (a-Si) thin-film transistor, a polysilicon thin-film transistor, or an oxide semiconductor thin-film transistor. The thin-film transistor 122 can be of an n-conductive type.

The pixel 13 further includes a junction capacitor 125 of the photodiode 121 and a capacitive element 126. The junction capacitor 125 and the capacitive element 126 are connected in parallel to the photodiode 121 between the switch TFT 122 and the bias line 107.

The image sensor 10 used as an X-ray imaging device stores signal charge in the amount corresponding to the amount of light incident on a photodiode 121 to the junction capacitor 125 and the capacitive element 126. The pixel 13 including not only the junction capacitor 125 of the photodiode 121 but also the capacitive element 126 attains a larger saturated signal amount with little change of manufacturing conditions for the photodiode 121.

The main control circuit 18 makes the thin-film transistor 122 in the pixel 13 conductive to read a signal by taking out the charge stored in the junction capacitor 125 and the capacitive element 126 to the external.

Specifically, the driver circuit 14 selects the gate lines 105 one by one and applies a pulse to turn the thin-film transistor 122 into a conductive state. The anode terminal of the photodiode 121 is connected with a bias line 107 and the signal line 106 is supplied with a reference potential by the signal detector circuit 16. Accordingly, the photodiode 121 is charged to the difference voltage between the bias potential of the bias line 107 and the reference potential. Generally, this difference voltage is set to a reverse bias voltage where the cathode potential is higher than the anode potential.

The charge required to recharge the photodiode 121 to the reverse-bias voltage depend on the amount of light incident on the photodiode 121. The signal detector circuit 16 reads the signal charge by integrating the current flowing in recharging the photodiode 121 to the reverse bias state.

In reading the signal charge, the voltage at the terminal of the thin-film transistor 122 connected with the signal line 106 is higher than the voltage at the terminal connected with the photodiode 121. Accordingly, in signal charge detection, the terminal connected with the signal line 106 is the drain and the terminal connected with the photodiode 121 is the source. The pixel 13 can include an additional element not shown in FIG. 2, such as an additional thin-film transistor.

Structural Example of Pixel

Hereinafter, some examples of the device structure of a pixel 13 are described. The photodiode 121, the thin-film transistor 122, and the capacitive element 126 included in a pixel 13 each have a layered structure on an insulating substrate.

Figure 3A:
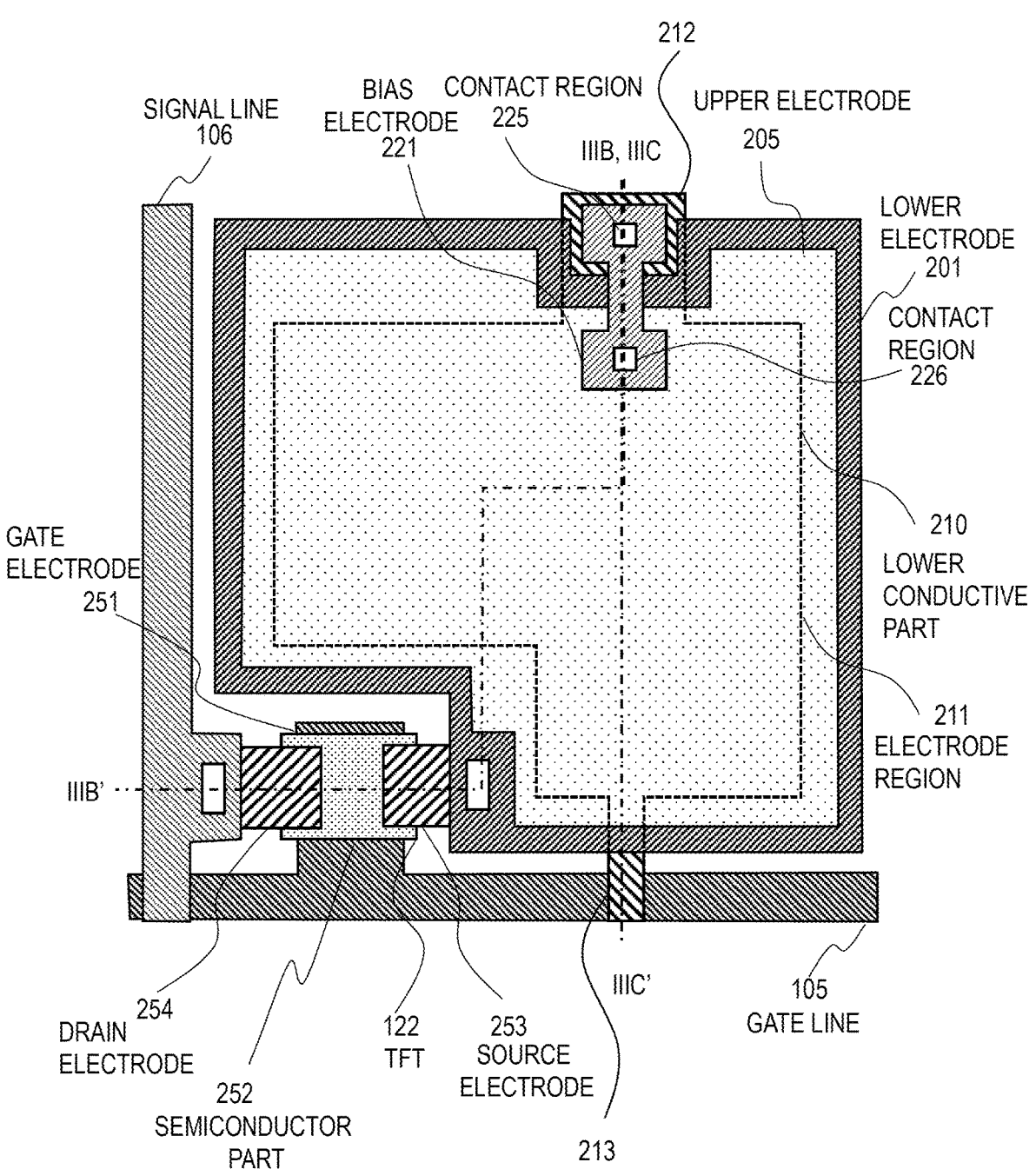
FIG. 3A is a plan diagram schematically illustrating an example of the structure of a pixel, a gate line, and a signal line.

FIG. 3A is a plan diagram schematically illustrating a structure of a pixel 13, a gate line 105, and a signal line 106. In FIG. 3A, the signal line 106 extends vertically; the gate line 105 extends horizontally; and a thin-film transistor 122 is disposed at the intersection of these lines.

The pixel 13 includes a lower electrode 201 and an upper electrode 205. In the configuration example of FIG. 3A, the whole upper electrode 205 overlaps the lower electrode 201 when viewed planarly. In other words, the whole area of the upper electrode 205 is included in the area of the lower electrode 201 when viewed planarly. As will be described later, the photodiode 121 is sandwiched between the lower electrode 201 and the upper electrode 205.

The pixel 13 further includes a thin-film transistor 122, a lower conducive part 210, and a bias electrode 221. The thin-film transistor 122 includes a gate electrode 251, a semiconductor part 252, a source electrode 253, and a drain electrode 254.

As will be described later, the lower conductive part 210 is located lower than the lower electrode 201. In FIG. 3A, the part of the lower conductive part 210 covered with the lower electrode 201 is outlined by a dashed line. The lower conductive part 210 includes an electrode region 211 and connector regions 212 and 213. The electrode region 211 is a wide region; the widths (horizontal lengths) of the connector regions 212 and 213 are smaller than the width of the electrode region 211. The connector regions 212 and 213 extend from the electrode region 211 upward and downward, respectively.

The whole area of the electrode region 211 is covered with the lower electrode 201. In other words, the whole electrode region 211 is opposed to the lower electrode 201. Each of the connector regions 212 and 213 is partially opposed to the lower electrode 201 and the remaining part extends to the outside of the lower electrode 201. The lower conductive part 210 includes a capacitor electrode, which is a region opposed to the lower electrode 201.

The capacitor electrode in the example of FIG. 3A includes the whole area of the electrode region 211 and parts of the connector regions 212 and 213. The capacitor electrode in the configuration example of FIG. 3A substantially corresponds to the electrode region 211. The capacitor electrode, the part of the lower electrode 201 opposed to the capacitor electrode, and the insulating part therebetween constitute a capacitive element 126. In the configuration example of FIG. 3A, the whole area of the electrode region 211 is in the areas of the lower electrode 201 and the upper electrode 205 when viewed planarly.

The bias electrode 221 interconnects the lower conductive part 210 and the upper electrode 205. Specifically, a contact region (interconnection region) 225 interconnects the connector region 212 of the lower conductive part 210 and the bias electrode 221. Another contact region 226 interconnects the upper electrode 205 and the bias electrode 221.

In the configuration example of FIG. 3A, a plurality of lower conductive parts 210 disposed along a signal line are connected to transmit a bias potential. The lower conductive part 210 in the configuration example of FIG. 3A is connected with the lower conductive parts 210 vertically adjacent thereto through the connector regions 212 and 213. The lower conductive part 210 is not connected with but is distant from the lower conductive parts 210 horizontally adjacent thereto. Each bias line 107 is included in a set of lower conductive parts 210 connected in a line. The bias potential is supplied from the lower conductive part 210 of the pixel 13 to the upper electrode 205 through the bias electrode 221.

The bias electrode 221 is connected with the lower conductive part 210 at the contact region 225 and connected with the upper electrode 205 at the contact region 226. The bias electrode 221 does not extend through the area of the upper electrode 205. The distal end of the bias electrode 221 in the direction directed from the contact region 225 to the contact region 226 is located above the upper electrode 205 when viewed planarly. In other words, the end of the bias electrode 221 drawn under the contact region 226 in FIG. 3A is located above the upper electrode 205.

The contact region 225 is located outside both the upper electrode 205 and the lower electrode 201. Each of the upper electrode 205 and the lower electrode 201 has a recess. The contact region 225 is located in the area of the recess of the lower electrode 201. The distance from the center of the contact region 226 to the end of the upper electrode 205 the virtual straight line originating from the center of the contact region 225 and passing through the center of the contact region 226 first crosses is shorter than the distance between the both ends of the upper electrode 205 the same virtual line crosses, for example, less than a half thereof.

Further, the ends of the bias electrode 221 on the left and the right from the contact region 226 are located above the upper electrode 205 when viewed planarly. Such a small overlap area of the bias electrode 221 and the upper electrode 205 as described above increases the light receiving area of the photodiode 121.

In the configuration example of FIG. 3A, the lower conductive part 210 is distant from both the gate line 105 and the signal line 106 without overlapping them when viewed planarly. The lower electrode 201 and the upper electrode 205 are also distant from both the gate line 105 and the signal line 106 without overlapping them when viewed planarly. Further, the lower conductive part 210 is distant from the semiconductor part 252 without overlapping it when viewed planarly. The lower electrode 201 and the upper electrode 205 are also distant from the semiconductor part 252 without overlapping it when viewed planarly.

Figure 3B:
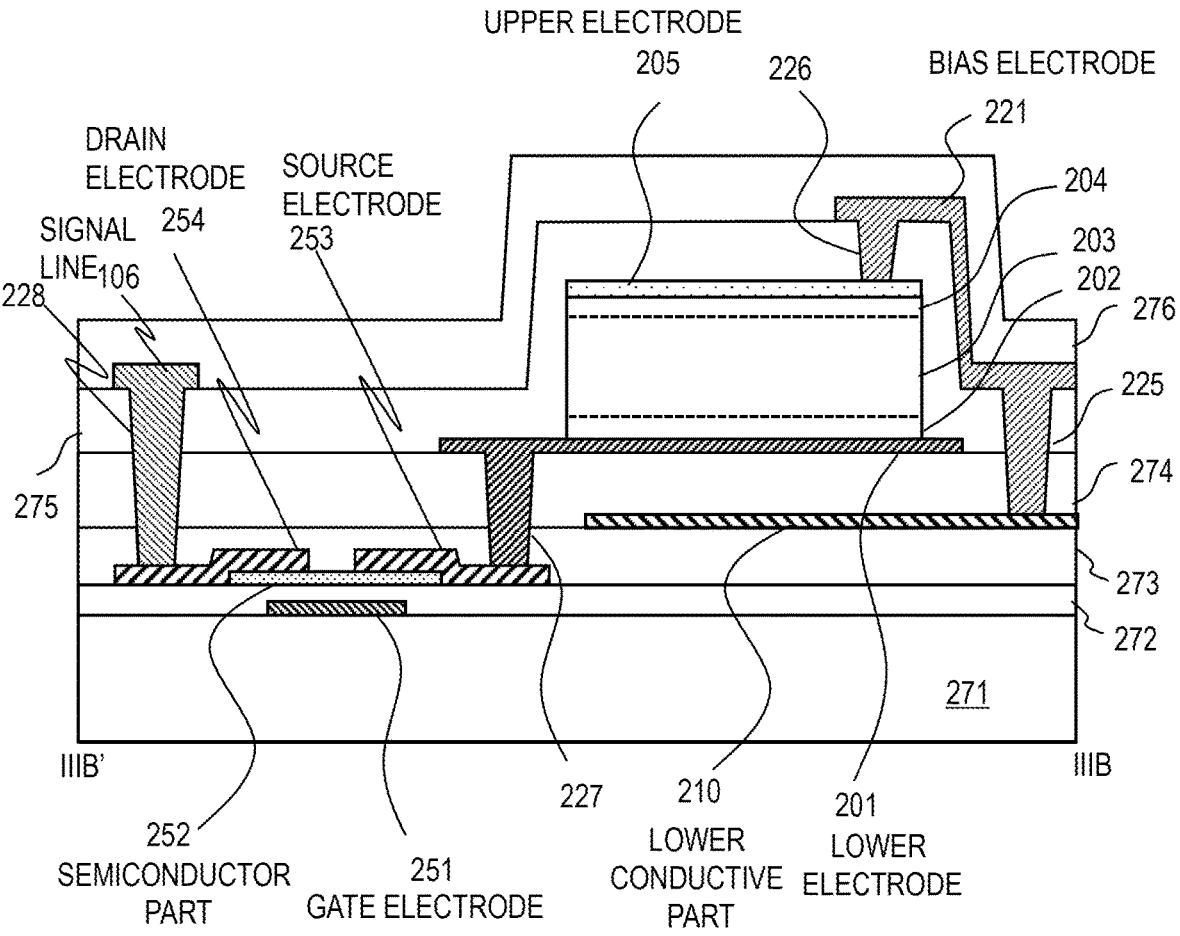
FIG. 3B is a cross-sectional diagram along the section line IIIB-IIIB' in FIG. 3A.
Figure 3C:
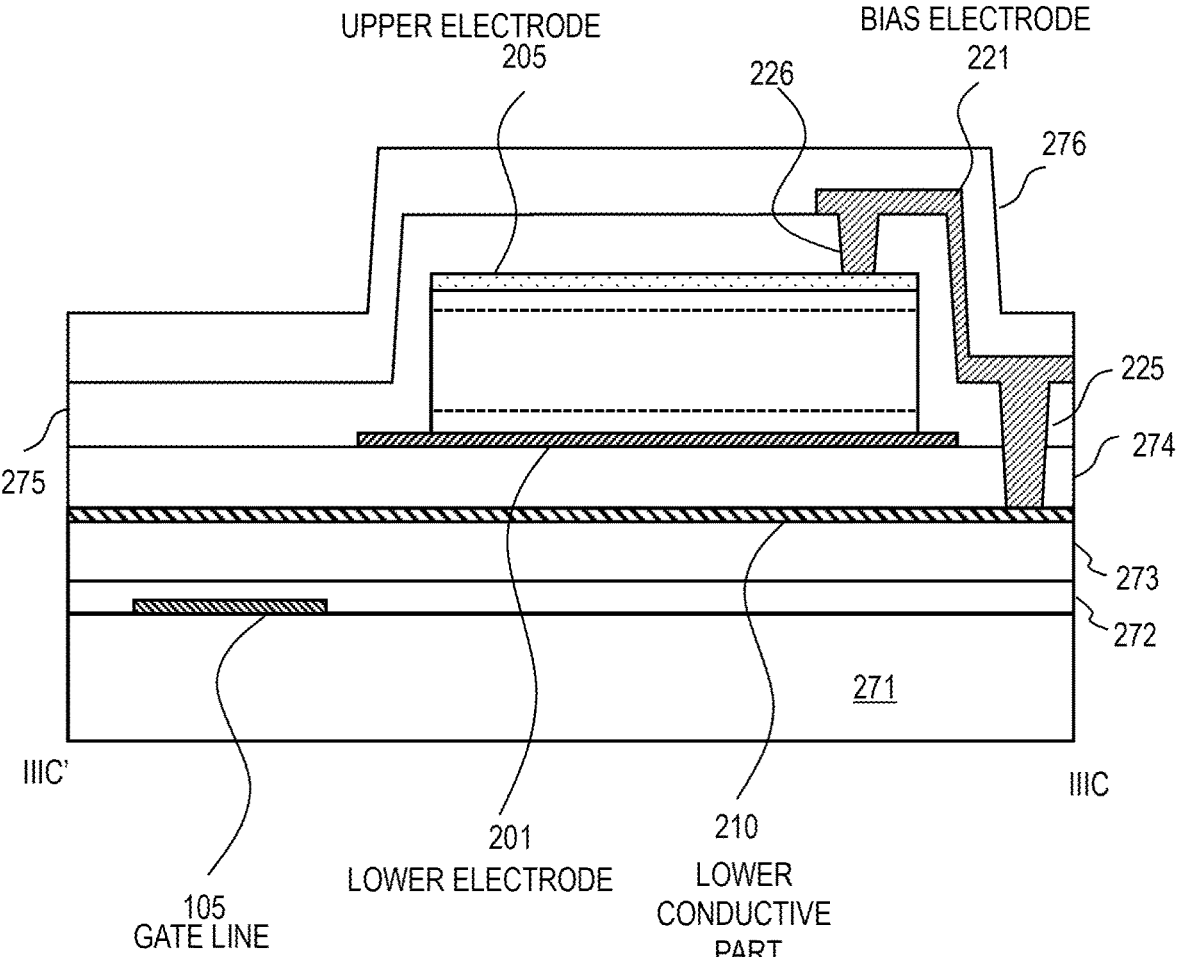
FIG. 3C is cross-sectional diagram along the section line IIIC-IIIC' in FIG. 3A.

Next, the cross-sectional structure of the pixel 13 illustrated in FIG. 3A is described. FIG. 3B is a cross-sectional diagram along the section line IIIB-IIIB' in FIG. 3A and FIG. 3C is a cross-sectional diagram along the section line 1110-1110' in FIG. 3A. Regarding the following description, the reference signs of some elements may be omitted from the drawings.

With reference to FIGS. 3B and 3C, the thin-film transistor 122 (see FIG. 3A) includes a gate electrode 251 provided on an insulating substrate 271, a gate insulating layer 272 above the gate electrode 251, and a semiconductor part 252 above the gate insulating layer 272.

As illustrated in FIG. 3A, the gate electrode 251 is a part projecting upward from the horizontally extending gate line 105; the gate electrode 251 is continued from the gate line 105. The gate electrode 251 and the gate line 105 are formed on the insulating substrate (insulating layer) 271 and they are included in the same conductive layer. A silicon insulating layer can be provided between the insulating substrate 271 and the conductive layer of the gate electrode 251 and the gate line 105.

Unseparated or separate conductive parts included in the same conductive layer are made of the same material above and in direct contact with the same insulating layer. In manufacture, the conductive parts of the same conductive layer are produced in the same manufacturing step. The conductive layer can have a single layer structure or a multi-layered structure.

In this configuration example, the thin-film transistor 122 has a bottom-gate structure and the gate electrode 251 is located lower than the semiconductor part 252. The thin-film transistor 122 further includes electrodes 253 and 254 above the gate insulating layer 272. The electrodes 253 and 254 are included in the same conductive layer.

Depending on the flow of carriers, one of the electrodes 253 and 254 is a source electrode and the other one is a drain electrode. In detecting the charge of the photodiode 121, the electrode 253 is a source electrode and the electrode 254 is a drain electrode. Accordingly, the electrode 253 is referred to as source electrode and the electrode 254 as drain electrode hereinafter.

The source electrode 253 and the drain electrode 254 are in direct contact with the semiconductor part 252. The source electrode 253 and the drain electrode 254 are formed to be in contact with a side and a part of the top face of the island-like semiconductor part 252.

The gate insulating layer 272 is formed to fully cover the gate electrode 251. The gate insulating layer 272 is provided between the gate electrode 251 and the semiconductor part 252. A first interlayer insulating layer 273 covers the whole thin-film transistor 122. Specifically, the first interlayer insulating layer 273 covers the top face of the semiconductor part 252 and the top faces of the source electrode 253 and the drain electrode 254.

The substrate 271 can be made of glass or resin. The gate electrode 251 is a conductor and can be made of a metal or silicon doped with impurities. The gate insulating layer 272 can be made of thermally oxidized silicon. The semiconductor for the semiconductor part 252 can be an oxide semiconductor or amorphous silicon. The oxide semiconductor contains at least one of In, Ga, and Zn and examples of the oxide semiconductor include amorphous InGaZnO (a-InGaZnO) and microcrystalline InGaZnO.

The source electrode 253 and the drain electrode 254 are conductors and can be a layer of a metal such as Mo, Ti, Al, or Cr or an alloy thereof or a laminate of those materials. The first interlayer insulating layer 273 is made of an inorganic or organic insulator. Although the thin-film transistor 122 illustrated in FIGS. 3A and 3B has a bottom-gate structure, the thin-film transistor 122 can have a top-gate structure or include both a top-gate electrode and a bottom-gate electrode.

The lower conductive part 210 is provided above the first interlayer insulating layer 273. The lower conductive part 210 is in direct contact with the first interlayer insulating layer 273. The lower conductive part 210 is located upper than the gate electrode 251 and the gate line 105 and lower than the lower electrode 201. The first interlayer insulating layer 273 is located between the lower conductive part 210 and the conductive layer of the gate electrode 251 and the gate line 105. A second interlayer insulating layer 274 is provided between the lower conductive part 210 and the lower electrode 201. The second interlayer insulating layer 274 is made of an inorganic or organic insulator. The second interlayer insulating layer 274 in this example is in direct contact with the lower electrode 201 and the lower conductive part 210.

When viewed planarly, the lower electrode 201 at least partially overlaps the lower conductive part 210 with the insulating layer 274 interposed therebetween, as illustrated in FIGS. 3A to 3C. In other words, at least a part of the lower electrode 201 covers at least a part of the lower conductive part 210 when viewed planarly. In this configuration example, a part of the lower electrode 201 lies over a part of the lower conductive part 210.

The lower electrode 201 is connected with the source electrode 253 of the thin-film transistor 122 through a contact region 227 in a via hole opened through the second interlayer insulating layer 274 and the first interlayer insulating layer 273, as illustrated in FIG. 3B. The lower electrode 201 is a conductor and can be a layer of a metal such as Cr, Mo, or Al or an alloy thereof or a laminate of those materials.

The photodiode 121 consists of a photoelectric conversion region sandwiched between the lower electrode 201 and the upper electrode 205 and the parts of the lower electrode 201 and the upper electrode 205 that are in contact with the photoelectric conversion region. The example of the photodiode 121 illustrated in FIGS. 3B and 3C is a PIN diode. A PIN diode has a thick depletion layer in the film thickness to detect light efficiently. The upper electrode 205 is a transparent electrode for the light from the scintillator; it can be made of ITO.

The photoelectric conversion region of the photodiode 121 includes an n-type amorphous silicon layer (film) 202 above the lower electrode 201, an intrinsic amorphous silicon layer (film) 203 above the n-type amorphous silicon layer 202, and a p-type amorphous silicon layer (film) 204 above the intrinsic amorphous silicon layer 203. The n-type amorphous silicon layer 202 in this configuration example is in direct contact with the lower electrode 201.

The upper electrode 205 is provided above the p-type amorphous silicon layer 204. The upper electrode 205 in this configuration example is in direct contact with the p-type amorphous silicon layer 204. The light to be detected enters the photodiode 121 through the upper electrode 205. The locations of the n-type amorphous silicon layer 202 and the p-type amorphous silicon layer 204 can be opposite and further, the intrinsic amorphous silicon layer 203 can be excluded.

A third interlayer insulating layer 275 is provided to cover the lower electrode 201, the silicon layers 202 to 204, and the upper electrode 205. The third interlayer insulating layer 275 is made of an inorganic or organic insulator. The bias electrode 221 and the signal line 106 are provided above the third interlayer insulating layer 275. The bias electrode 221 and the signal line 106 in this example are in direct contact with the third interlayer insulating layer 275. The signal line 106 is connected with the drain electrode 254 of the thin-film transistor 122 through a contact region 228 in a via hole opened through the third interlayer insulating layer 275, the second interlayer insulating layer 274, and the first interlayer insulating layer 273.

The bias electrode 221 is connected with the upper electrode 205 through a contact region 225-226 provided in a via hole opened through the third interlayer insulating layer 275. The bias electrode 221 is also connected with the lower conductive part 210 through a contact region 226-225 provided in a via hole opened through the third interlayer insulating layer 275 and the second interlayer insulating layer 274. The bias electrode 221 is a conductor and can be a layer of a metal such as Mo, Ti, or Al or an alloy thereof or a laminate of those materials.

A passivation layer (film) 276 is provided to cover the signal line 106, the bias electrode 221, and the third interlayer insulating layer 275. The passivation layer 276 covers the whole area of the pixel region 12. The passivation layer 276 is made of an inorganic or organic insulator. Not-shown scintillator is provided above the passivation layer 276.

The scintillator covers the whole pixel region 12. The scintillator emits light by being excited by radioactive rays. Specifically, the scintillator converts the received x-rays into light having a wavelength detectable for the photodiode 121. The photodiode 121 generates signal charge in the amount in accordance with the light from the scintillator and stores the signal charge to the junction capacitor 125 and the capacitive element 126 (see FIG. 2).

The photodiode 121 in the above-described configuration example is located upper than the thin-film transistor 122. This disposition is advantageous because the attenuation of received light by the insulating layers is smaller and the manufacture of thin-film transistors and photodiodes in semiconductor processes is easier.

In the configuration described with reference to FIGS. 3A to 3C, the bias potential is supplied from the lower conductive part 210 located lower than the upper electrode 205 to the upper electrode 205 through the bias electrode 221. As illustrated in FIG. 3A, the bias electrode 221 covers only a part of an end of the upper electrode 205. This configuration allows the upper electrode 205 to have a small area covered with a conductor so that the photodiode 121 can have a large light receiving area, compared to the configuration where the bias line extends above the upper electrode 205 from end to end.

There are needs for photodiode arrays to have higher resolution and higher precision; these requests are satisfied by reducing the pixel size. However, reduction in pixel size reduces the area of a photodiode. The junction capacitance of the photodiode also becomes smaller to decrease the saturated signal amount.

The saturated signal amount is one of the factors to determine the dynamic range. The upper end of the dynamic range is determined by the saturated signal amount. The saturated signal amount is determined by the pixel capacitance and the bias potential. The dynamic range depends on not only the saturated signal amount but also the magnitude of the noise generated by various causes such as the dark current of the photodiode. The lower end of the dynamic range is determined by the magnitude of the noise.

The dark current depends on the bias potential and therefore, the dark current can be reduced by lowering the bias potential. However, lowering the bias potential reduces the saturated signal amount, too; the dynamic range does not expand. If the saturated signal amount is reduced, the photodiode cannot output a signal corresponding to the intensity of light (X-rays) when it receives light having an intensity higher than the saturated signal amount.

For this reason, demanded is increasing the saturated signal amount under the restriction that the pixel size has to be reduced. As described above, the saturated signal amount depends on the pixel capacitance and the bias potential, the saturated signal amount can be increased by increasing the pixel capacitance.

Figure 4:
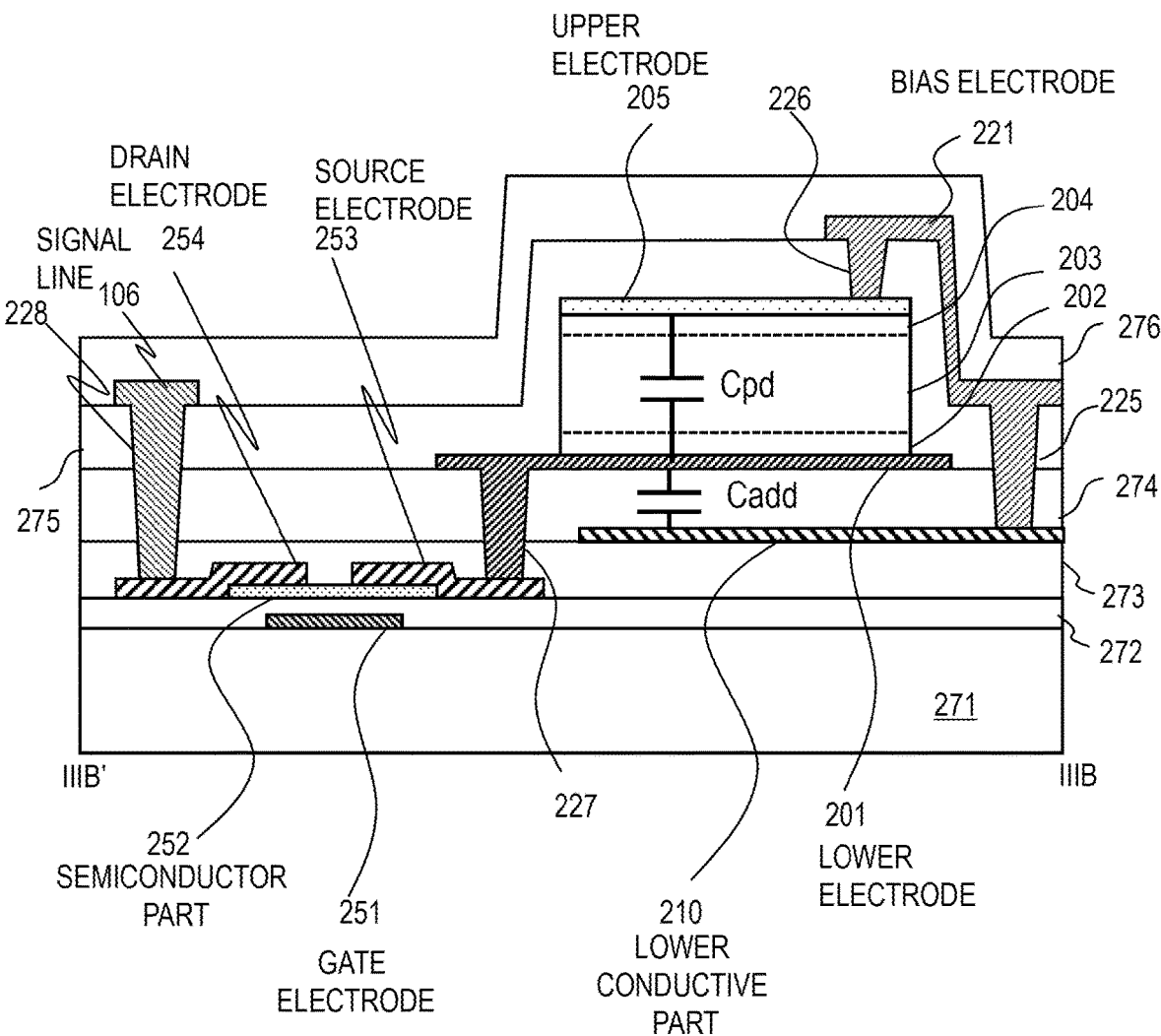
FIG. 4 illustrates a pixel capacitor in the configuration described with reference to FIGS. 3A to 3C.

FIG. 4 illustrates the pixel capacitor in the configuration described with reference to FIGS. 3A to 3C. The pixel 13 includes a junction capacitor Cpd of the photodiode 121 and further, a capacitor Cadd between the lower electrode 201 and the lower conductive part 210. That is to say, the lower electrode 201 and the lower conductive part 210 makes an additional capacitive element together with the insulating layer therebetween (a part of the interlayer insulating layer 274).

Providing an electrode-like lower conductive part 210 under the lower electrode 201 as described above generates a capacitor between the lower electrode 201 and the lower conductive part 210. The generated capacitor corresponds to the additional capacitive element 126 that is parallel to the junction capacitor 125 of the photodiode 121 (see FIG. 2). As a result, the pixel capacitance increases to raise the saturated signal amount of the pixel.

Especially for a product having small-size pixels, changing the junction capacitance in light of the manufacturing conditions is difficult because it affects other characteristics such as quantum efficiency and dark current. However, this structure includes a capacitive element using a conductive layer lower than the lower electrode 201 and therefore, the saturated signal amount can be increased with little change of the manufacturing conditions for a photodiode 121. Further, the additional capacitance Cadd can be changed desirably by changing the size of the lower conductive part 210 or the distance to the lower electrode 201 in view of the application or purpose.

This configuration can avoid the reduction in saturated signal amount but can reduce the dark current with the capacitive element 126 added in parallel to the photodiode 121 and a low bias potential. Hence, this configuration can increase the dynamic range.

Since the lower conductive part 210 is located lower than the lower electrode 201, its area can be increased without affecting the light-receiving region. Accordingly, this configuration reduces the possibility of disconnection and further, reduces the noise caused by the gate line 105 effectively.

In the configuration described with reference to FIGS. 3B and 3C, the layer located between the gate line 105 and the lower electrode 201 includes the lower conductive part 210. This configuration makes the parasitic capacitance generated by the pixel electrode and the gate line 105 small (because of the electrostatic shielding effect of the electrode having a fixed potential). When the parasitic capacitance is small, the noise added by the gate line 105 to the lower electrode 201 is made small.

More detailed explanation is provided as follows. In a case where the lower electrode 201 is connected with the gate line 105 through a parasitic capacitor, the gate line 105 could become a noise source having a noise voltage Vn. Accordingly, a noise current flows to the lower electrode 201 through the parasitic capacitor and noise is generated at the lower electrode 201 by electrostatic induction. The magnitude of this noise is proportional to the parasitic capacitance.

The lower conductive part 210 located in the middle between the gate line 105 and the lower electrode 201 separates the parasitic capacitor between the gate line 105 and the lower electrode 201 into three capacitors: a capacitor between the gate line 105 and the lower electrode 201, a capacitor between the gate line 105 and the lower conductive part 210, and a capacitor between the lower conductive part 210 and the lower electrode 201. The lower conductive part 210 is fixed at the bias potential all the time. For this reason, the noise current originated from the gate line 105 flows mainly between the gate line 105 and the lower conductive part 210, so that the noise current to the lower electrode 201 becomes small.

This disposition such that the lower conductive part 210 for transmitting the bias potential is located lower than the lower electrode 201 increases the saturated signal amount of the pixel 13 and reduces the noise originated from the gate line 105.

As described above, the switch transistor of the pixel can employ a semiconductor having desirable characteristics. The switch transistor in an embodiment of this specification has a semiconductor part having a mobility higher than 5 cm$^2$/Vs.

Since the above-described addition of the capacitive element 126 increases the pixel capacitance, the write rate after turning on the transistor is lowered. As a result, the signal charge of the pixel 13 cannot be read sufficiently to worsen the image lag characteristics. Accordingly, the switch element having the characteristic of the above-described mobility is used for more appropriate and accurate signal reading. The thin-film transistor having this characteristic can be a switch transistor employing a high-mobility semiconductor such as an oxide semiconductor or low-temperature polysilicon.

Other Structural Examples of Pixel

Figure 5A:
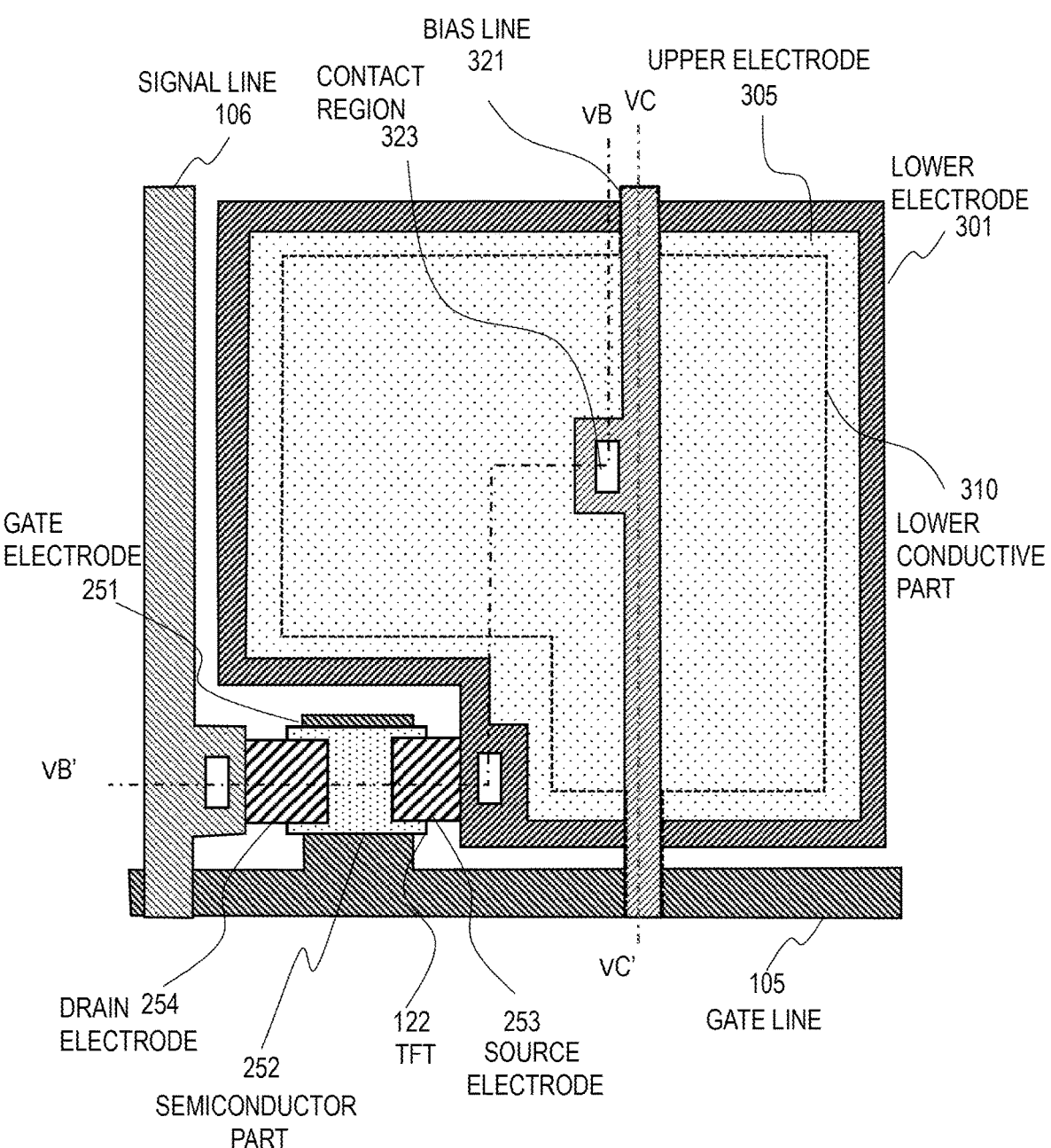
FIG. 5A is a plan diagram schematically illustrating another example of the structure of a pixel, a gate line, and a signal line.
Figure 5B:
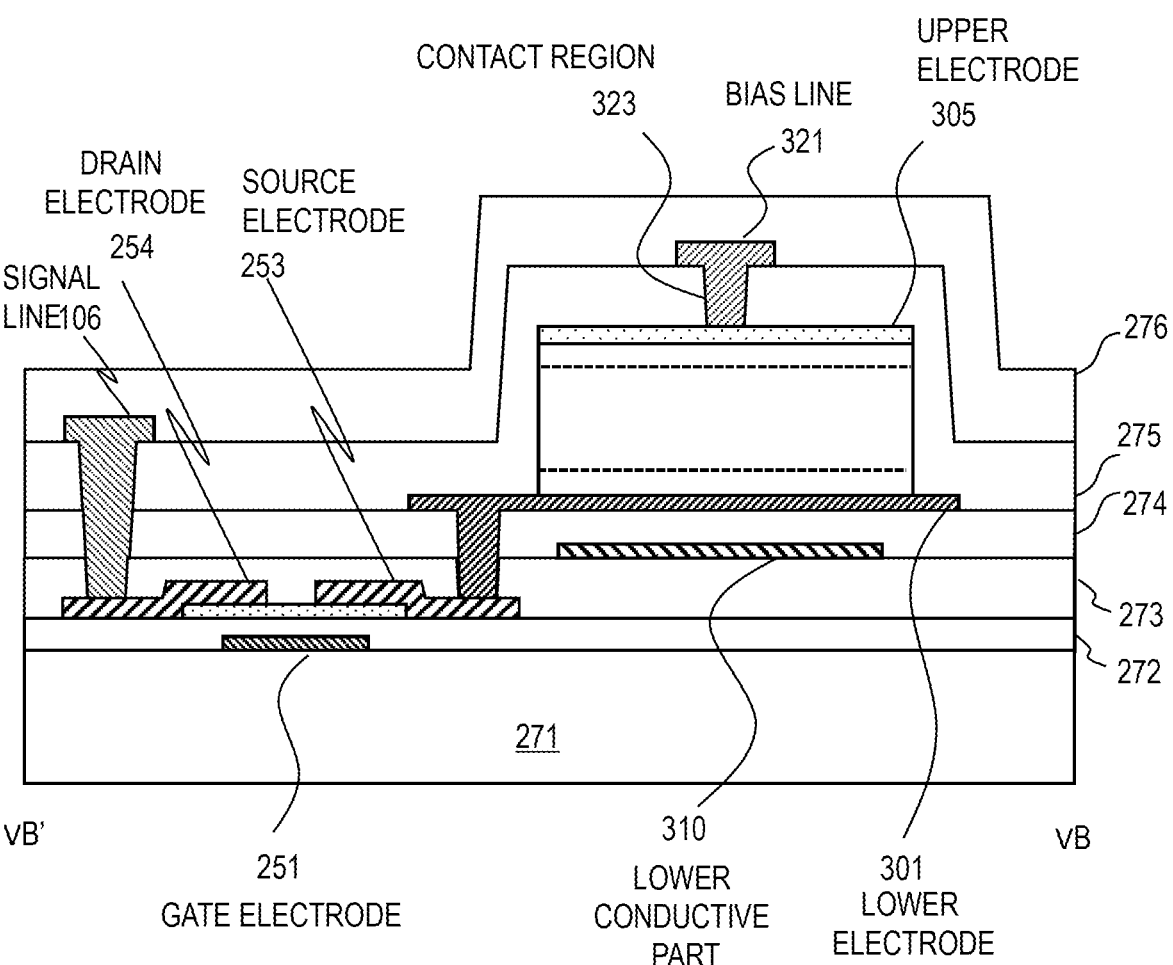
FIG. 5B is a cross-sectional diagram along the section line VB-VB' in FIG. 5A.
Figure 5C:
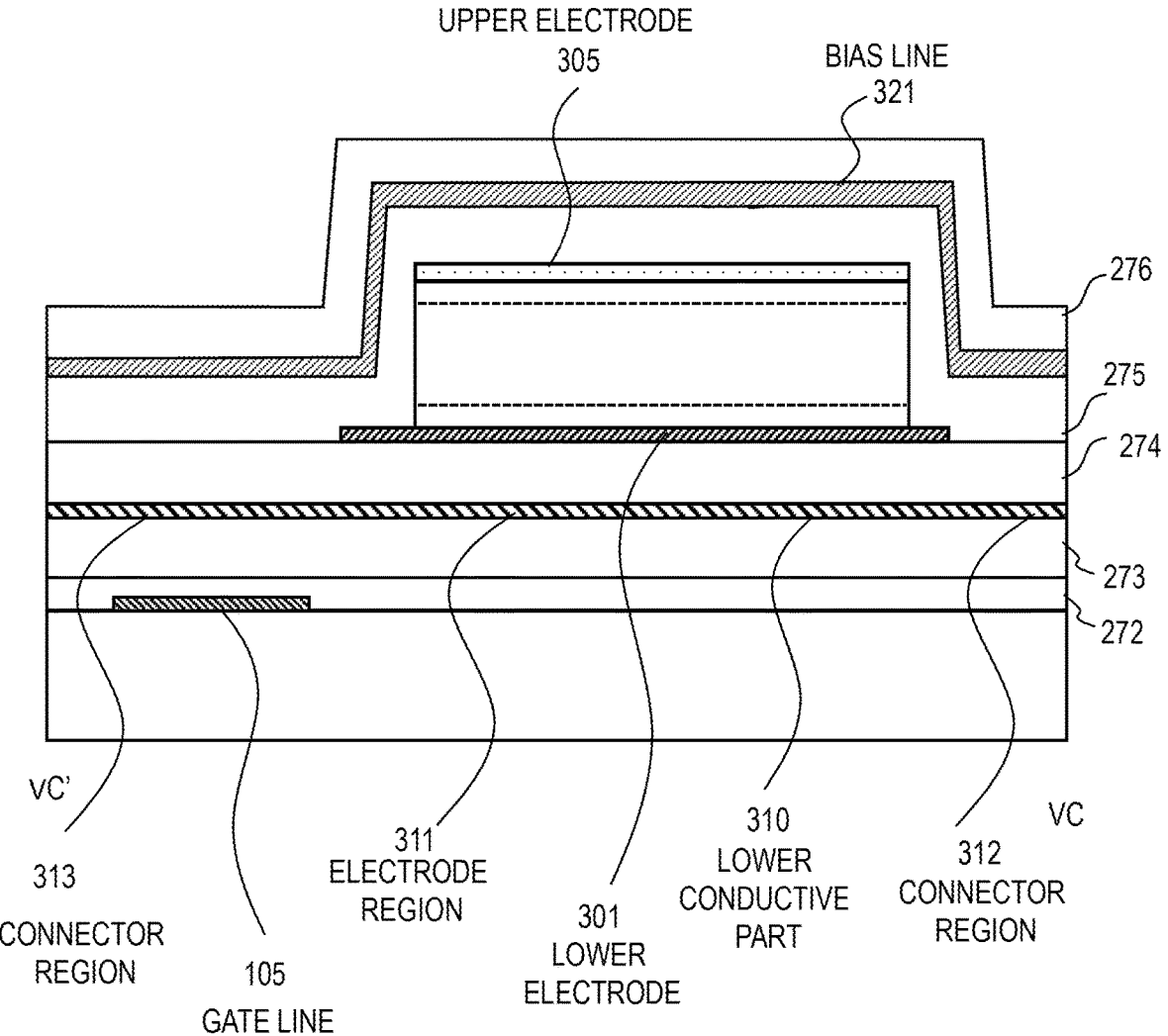
FIG. 5C is cross-sectional diagram along the section line VC-VC' in FIG. 5A.

Hereinafter, other configuration examples of a pixel are described. FIG. 5A is a plan diagram schematically illustrating another structure of a pixel 13, a gate line 105, and a signal line 106. FIG. 5B is a cross-sectional diagram along the section line VB-VB' in FIG. 5A and FIG. 5C is a cross-sectional diagram along the section line VC-VC' in FIG. 5A. The following mainly describes differences from the configuration described with reference to FIGS. 3A to 3C.

This configuration example includes a bias line 321 in place of the bias electrode 221 in FIGS. 3A to 3C. The bias line 321 extends in the vertical direction in FIG. 5A and it is connected with the upper electrodes 305 of a plurality of pixels 13 through their contact regions 323. The bias line 321 extends above the upper electrode 305 from its one end to the opposite end. The bias line 321 can be made of the same material as the bias electrode 221.

The upper electrode 305 and the lower electrode 301 in the configuration of FIG. 5A do not have a recess like the upper electrode 205 and the lower electrode 201 in FIG. 3A. As illustrated in FIGS. 5B and 5C, the bias line 321 is provided above and in direct contact with the third interlayer insulating layer 275. The bias line 321 is connected with the upper electrode 205 through a contact region 323 provided through the third interlayer insulating layer 275.

In the pixel 13, the lower conductive part 310 is not interconnected with the upper electrode 305 and is electrically separate from the upper electrode 305. The lower conductive part 310 includes an electrode region 311 and connector regions 312 and 313 extending vertically from the electrode region 311, as illustrated in FIG. 5C. The widths of the connector regions 312 and 313 in this configuration example are equal to or narrower than the width of the bias line 321. The lower conductive part 310 is connected with the lower conductive parts 310 of the vertically adjacent pixels 13 through the connector regions 312 and 313. The lower conductive part 310 can be interconnected with the bias line 321 outside the pixel region 12.

In this configuration example, each column of lower conductive parts 310 is supplied with a bias potential or a constant potential different from the bias potential from the signal detector circuit 16, for example. A lower conductive part 310 makes an additional capacitive element 126 together with the lower electrode 301 and the second interlayer insulating layer 274. The lower conductive part 310 also functions to reduce the noise from the gate line 105 to the lower electrode 301.

Figure 6A:
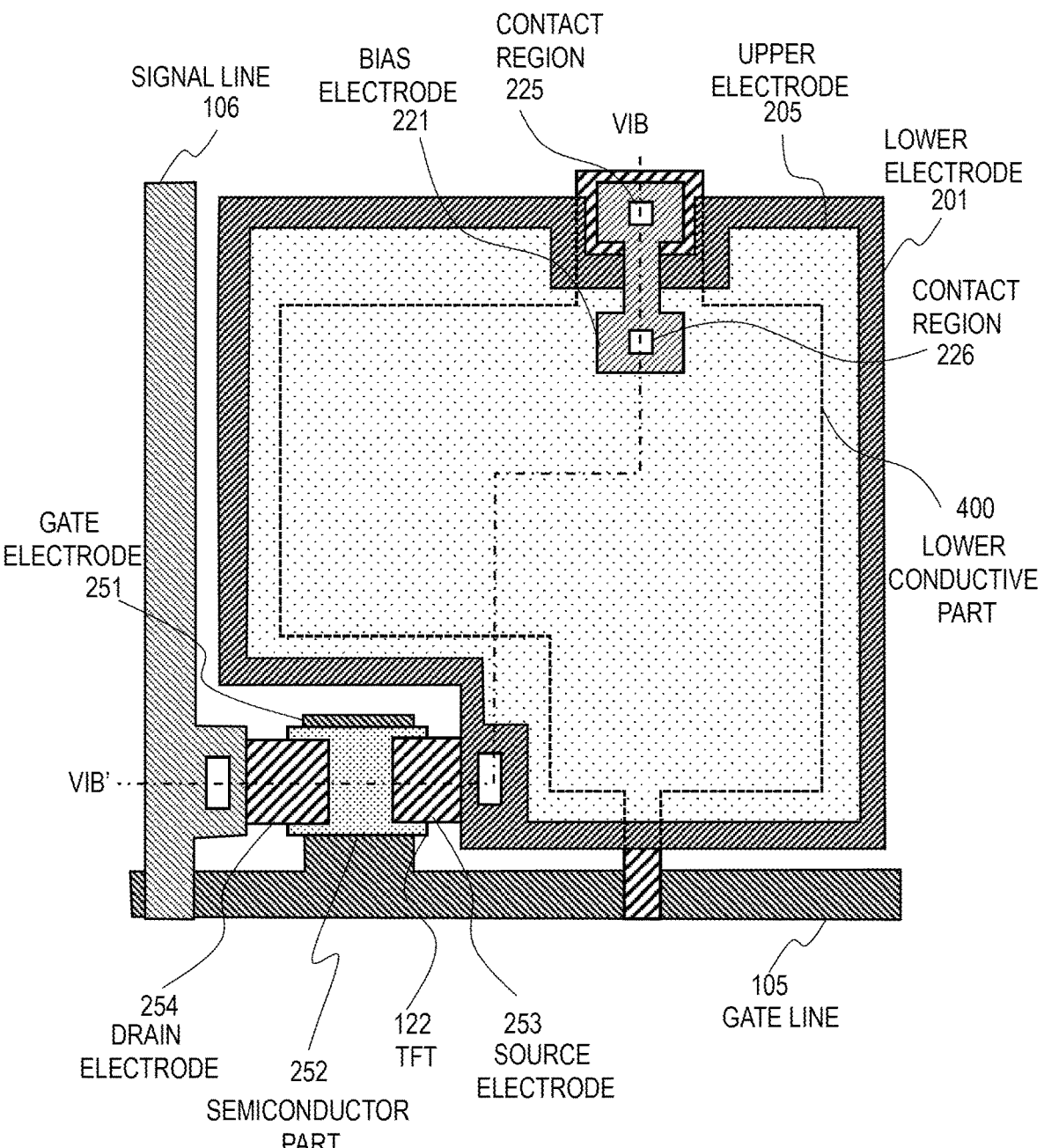
FIG. 6A is a plan diagram schematically illustrating still another example of the structure of a pixel, a gate line, and a signal line.
Figure 6B:
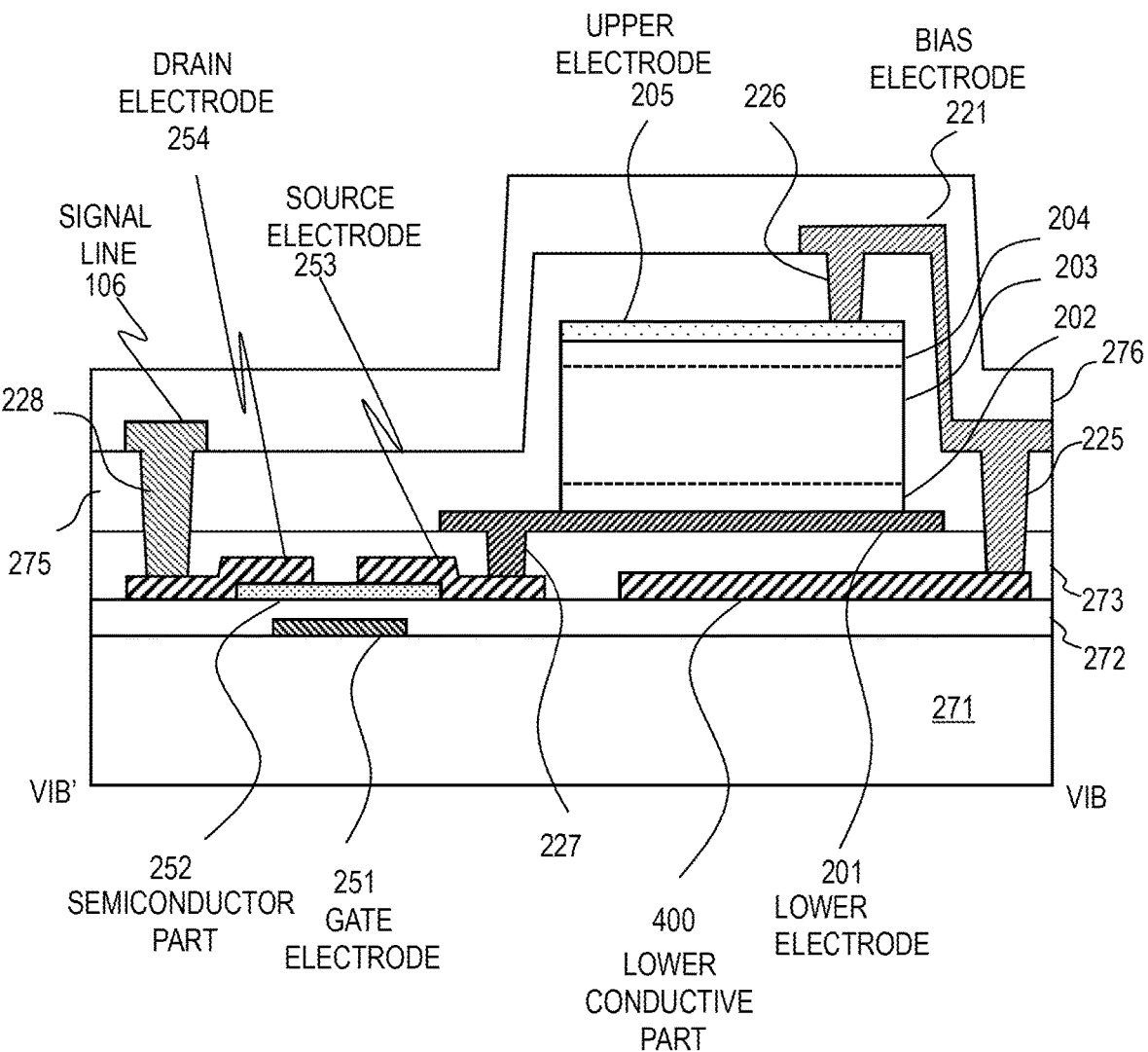
FIG. 6B is a cross-sectional diagram along the section line VIB-VIB' in FIG. 6A.

FIG. 6A is a plan diagram schematically illustrating still another structure of a pixel 13, a gate line 105, and a signal line 106. FIG. 6B is a cross-sectional diagram along the section line VIB-VIB' in FIG. 6A. The following mainly describes the differences from the configuration described with reference to FIGS. 3A to 3C. In this configuration example, the lower conductive part is included in the same conductive layer as the source electrode and the drain electrode. This configuration simplifies the manufacturing process.

As illustrated in FIG. 6B, the lower conductive part 400 is provided above and in direct contact with the gate insulating layer 272. The lower conductive part 400 is made of the same material as the source electrode 253 and the drain electrode 254 of the thin-film transistor. The lower conductive part 400 is included in the same layer as the source electrode 253 and the drain electrode 254. The lower conductive part 400 can have the same planar shape as the lower conductive part 210 in FIG. 3A.

Figure 7A:
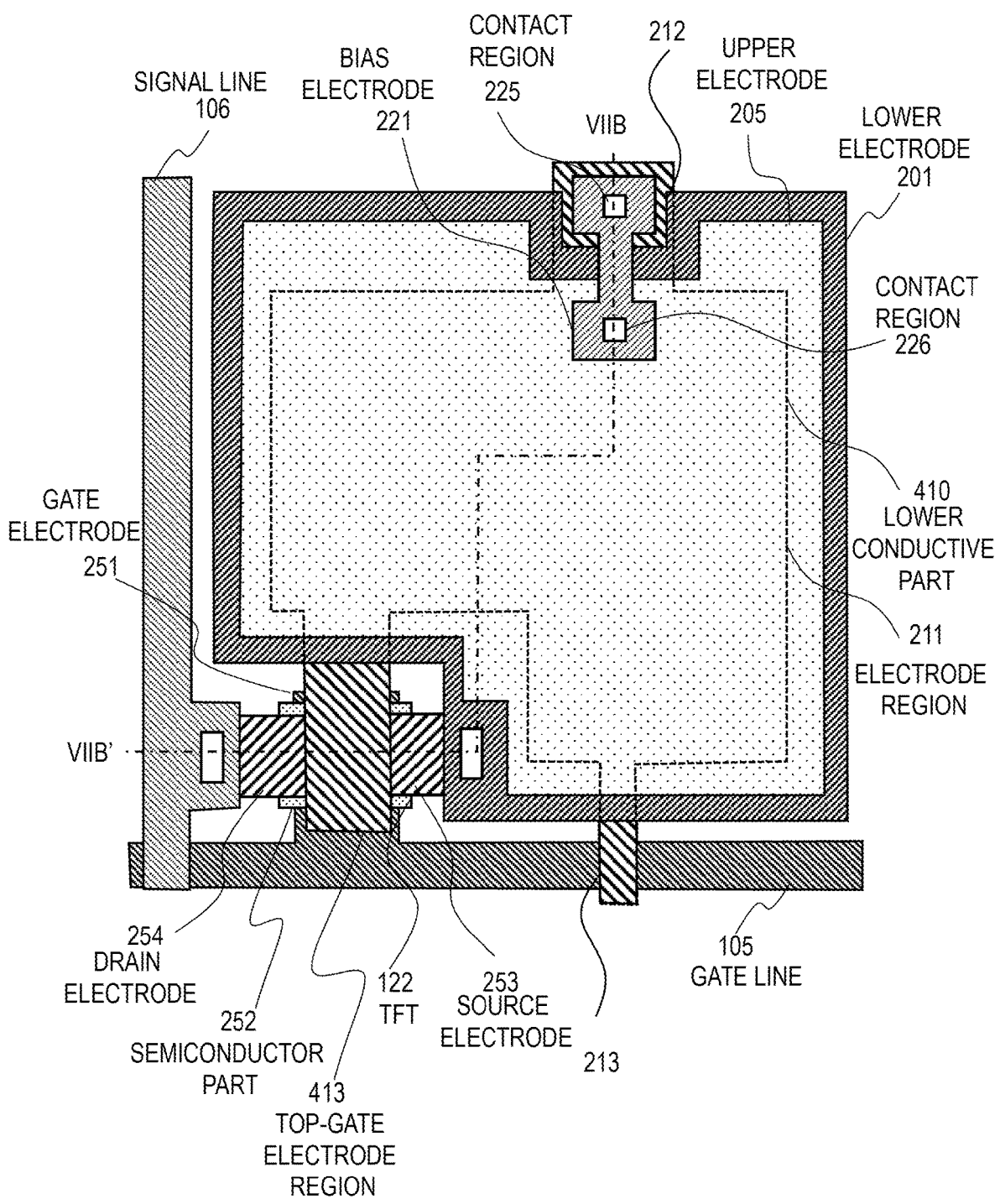
FIG. 7A is a plan diagram schematically illustrating still another example of the structure of a pixel, a gate line, and a signal line.
Figure 7B:
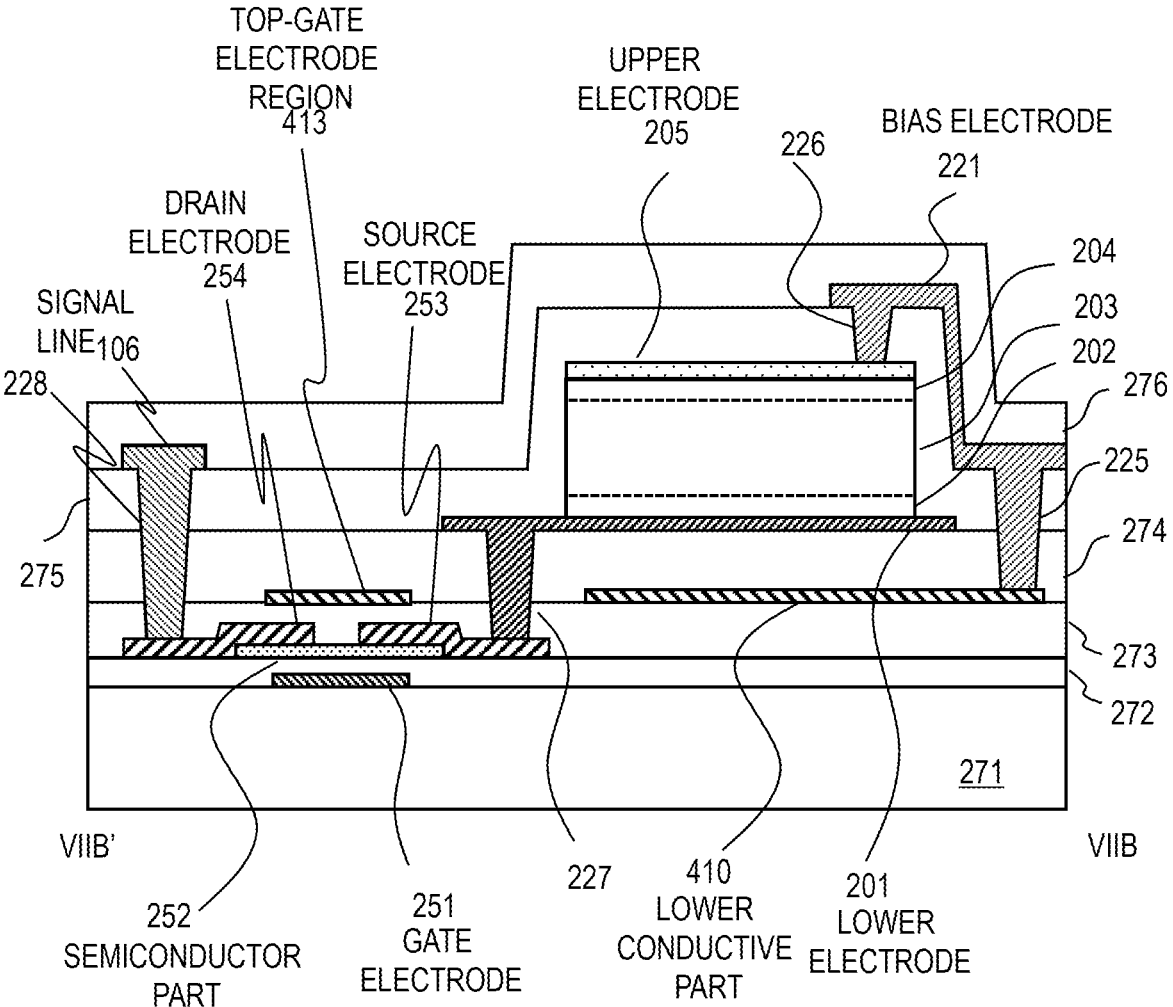
FIG. 7B is a cross-sectional diagram along the section line VIIB-VIIB' in FIG. 7A.

FIG. 7A is a plan diagram schematically illustrating still another structure of a pixel 13, a gate line 105, and a signal line 106. FIG. 7B is a cross-sectional diagram along the section line VIIB-VIIB' in FIG. 7A. The following mainly describes the differences from the configuration described with reference to FIGS. 3A to 3C. As illustrated in FIG. 7A, the lower conductive part 410 in this configuration example includes a top-gate electrode region 413, in addition to the electrode region for the additional capacitive element 126.

The top-gate electrode region 413 extends from the electrode region 211 toward the thin-film transistor 122. The top-gate electrode region 413 covers the channel region between the source electrode 253 and the drain electrode 254 when viewed planarly. The top-gate electrode region 413 can cover only a part of the channel region.

As illustrated in FIG. 7B, the first interlayer insulating layer 273 (a part thereof) is located between the top-gate electrode region 413 and the semiconductor part 252. The top-gate electrode region 413 controls the threshold of the thin-film transistor 122. The top-gate electrode region 413 can also reduce the light incident onto the semiconductor part 252.

As described above, an oxide semiconductor TFT having high mobility can be employed as the thin-film transistor 122. The threshold of an oxide semiconductor TFT varies easily in response to the external stimuli (such as light, voltage, and stress). Accordingly, the thin-film transistor 122 has a dual gate structure including a lower bottom-gate electrode 251 and an upper top-gate electrode 413 as illustrated in FIG. 7A, so that the threshold can be controlled with the top-gate potential.

Each photodiode 121 in a photodiode array is usually fixed to a reverse-bias mode. In the case where the top-gate electrode region 413 is supplied with a negative potential, the threshold shifts in the positive direction because of the top-gate potential, compared to the threshold in the single gate structure. Accordingly, if the threshold is shifted in the negative direction because of an external stimulus, the top gate has effect to compensate for the negative shift.

Figure 8A:
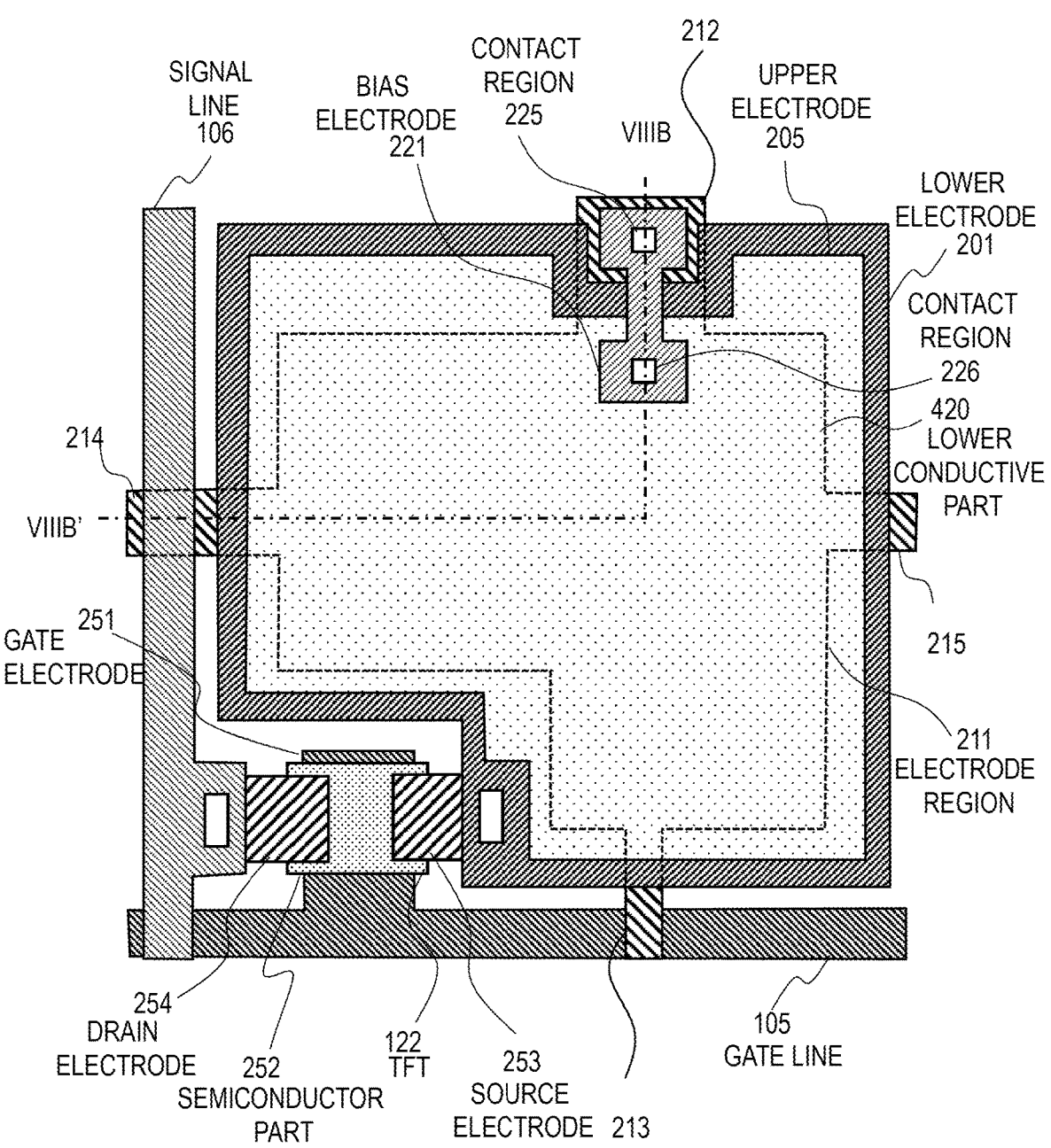
FIG. 8A is a plan diagram schematically illustrating still another example of the structure of a pixel, a gate line, and a signal line.
Figure 8B:
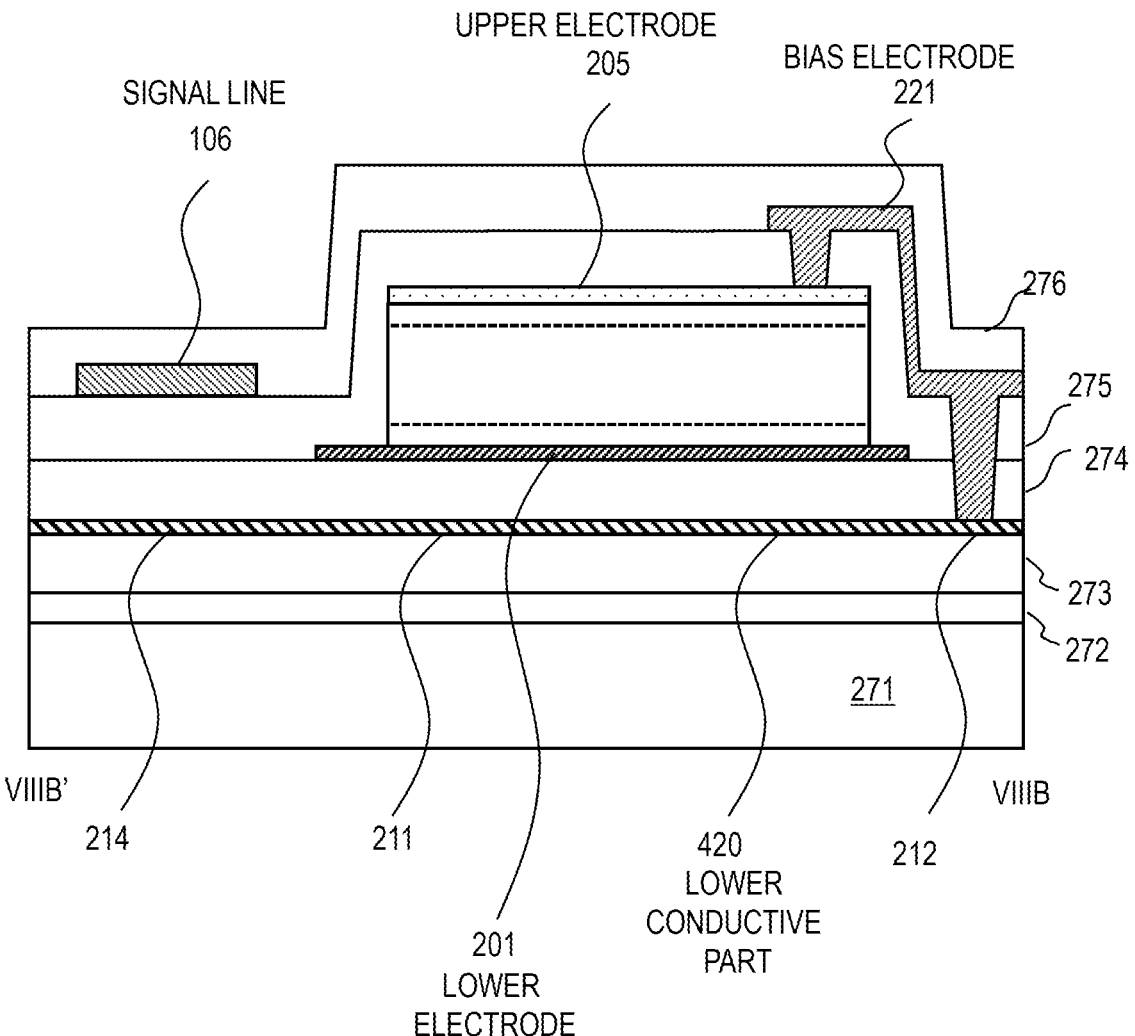
FIG. 8B is a cross-sectional diagram along the section line VIIIB-VIIIB' in FIG. 8A.

FIG. 8A is a plan diagram schematically illustrating still another structure of a pixel 13, a gate line 105, and a signal line 106. FIG. 8B is a cross-sectional diagram along the section line VIIIB-VIIIB' in FIG. 8A. The following mainly describes the differences from the configuration described with reference to FIGS. 3A to 3C.

As illustrated in FIG. 8A, the lower conductive part 420 is connected with the lower conductive parts of the horizontally adjacent pixels 13, in addition to the lower conductive parts of the vertically adjacent pixels 13. The lower conductive part 420 is connected with the lower conductive parts of the horizontally adjacent pixels 13 through connector regions 214 and 215. The connector regions 214 and 215 are parts of the lower conductive part 420. This configuration avoids disconnection of the bias line transmitting a bias potential more effectively.

Figure 9A:
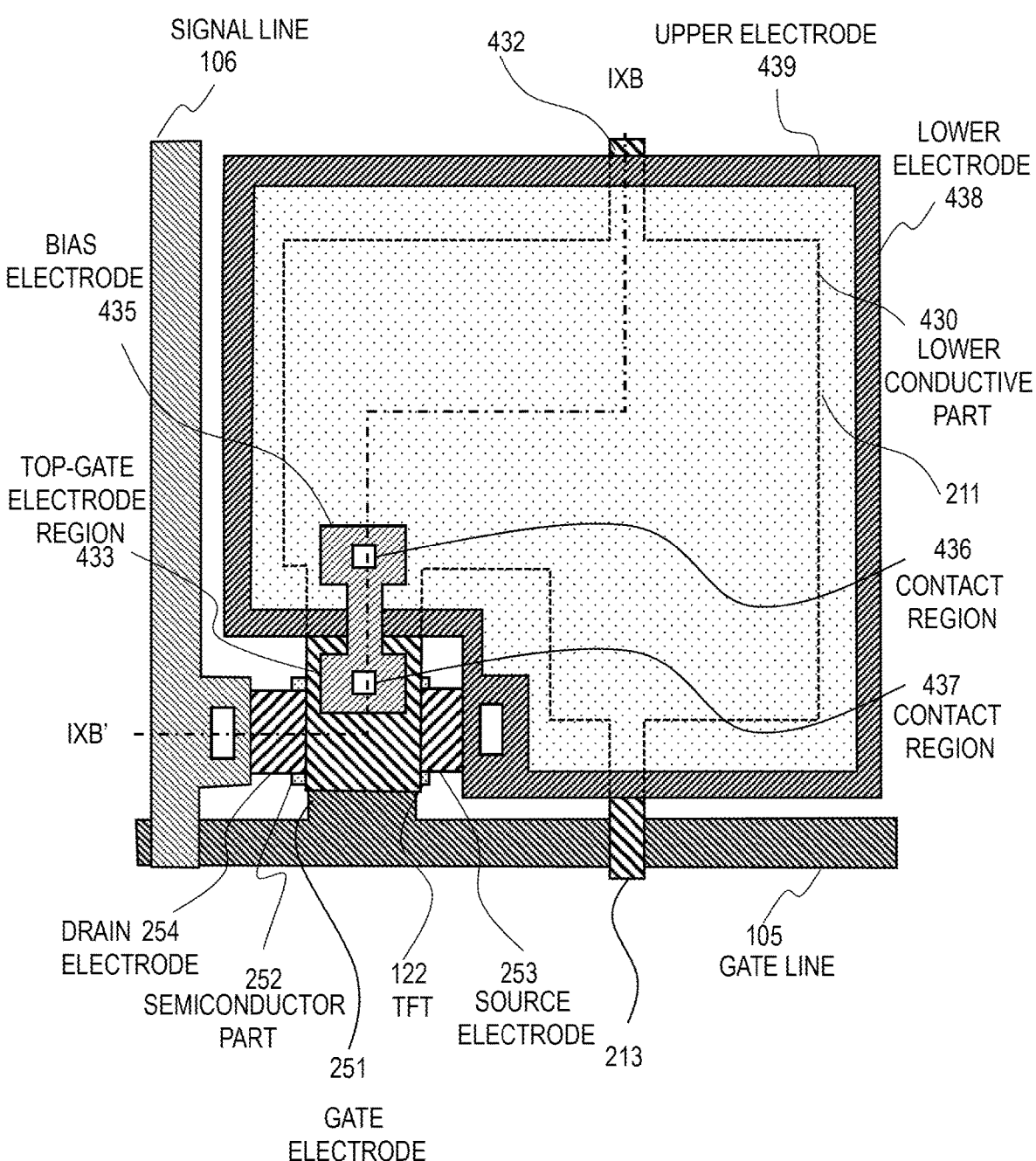
FIG. 9A is a plan diagram schematically illustrating still another example of the structure of a pixel, a gate line, and a signal line.
Figure 9B:
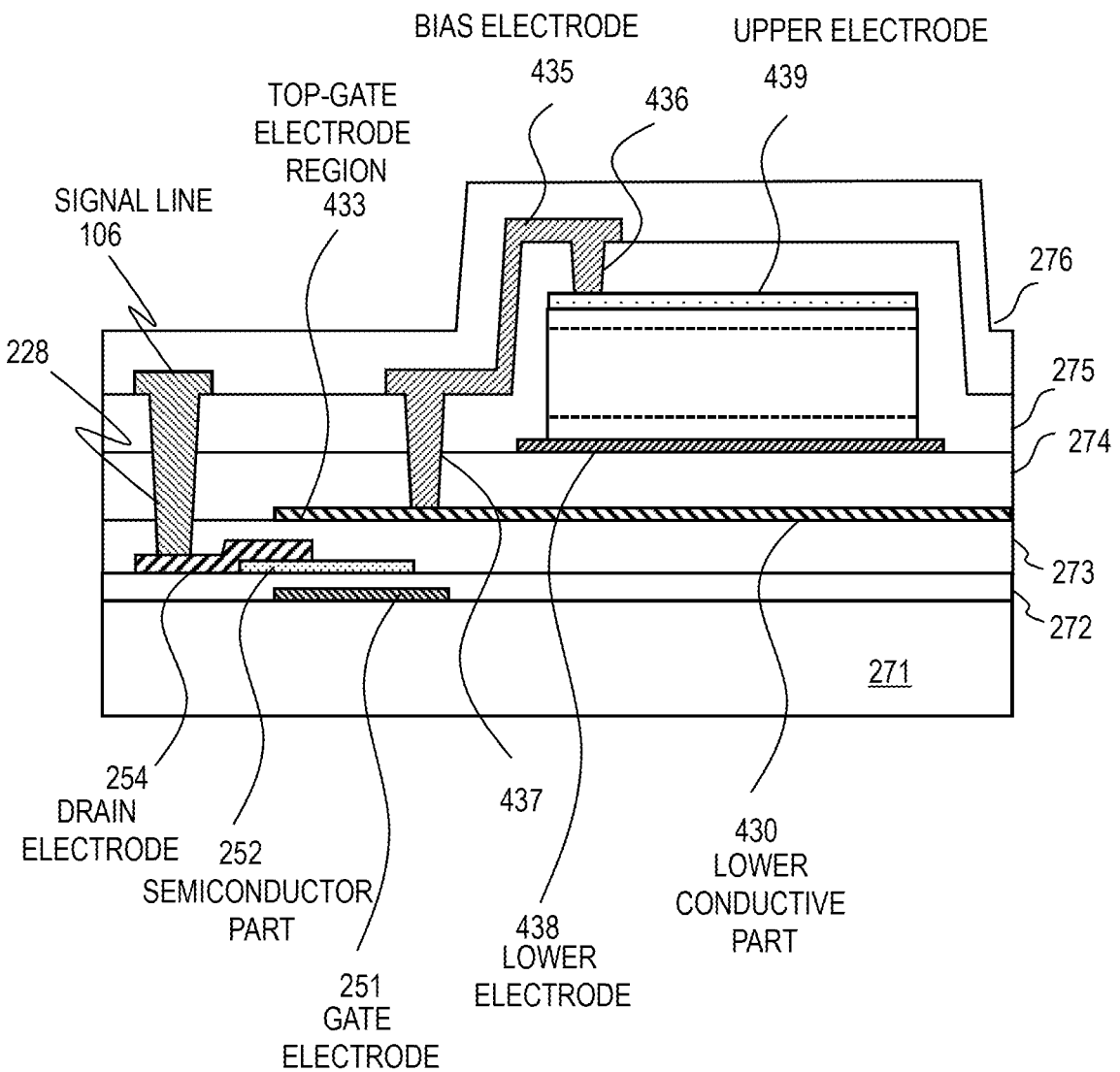
FIG. 9B is a cross-sectional diagram along the section line IXB-IXB' in FIG. 9A.

FIG. 9A is a plan diagram schematically illustrating still another structure of a pixel 13, a gate line 105, and a signal line 106. FIG. 9B is a cross-sectional diagram along the section line IXB-IXB' in FIG. 9A. The following mainly describes the differences from the configuration illustrated in FIGS. 7A and 7B.

As illustrated in FIG. 9A, a bias electrode 435 is connected with the top-gate electrode region 433 of the lower conductive part 430 through a contact region (first contact region) 437. The bias electrode 435 is also connected with the upper electrode 439 through a contact region (second contact region) 436. The bias electrode 435 can have the same shape as the bias electrode in FIG. 7A.

As illustrated in FIG. 9B, the contact region 436 is provided through the third interlayer insulating layer 275 to interconnect the bias electrode 435 and the upper electrode 439. The contact region 437 is provided through the third interlayer insulating layer 275 and the second interlayer insulating layer 274 to interconnect the bias electrode 435 and the top-gate electrode region 433 (the lower conductive part 430).

Compared to the configuration example of FIG. 7A, the lower electrode 438 and the upper electrode 439 in FIG. 9A do not have a recess on the opposite side of the thin-film transistor 122. Accordingly, this configuration attains a larger light-receiving area (aperture rate) of the photodiode 121. As illustrated in FIG. 9A, the lower conductive part 430 is connected with the lower conductive parts of the vertically adjacent pixels through the connector regions 432 and 213.

Figure 10A:
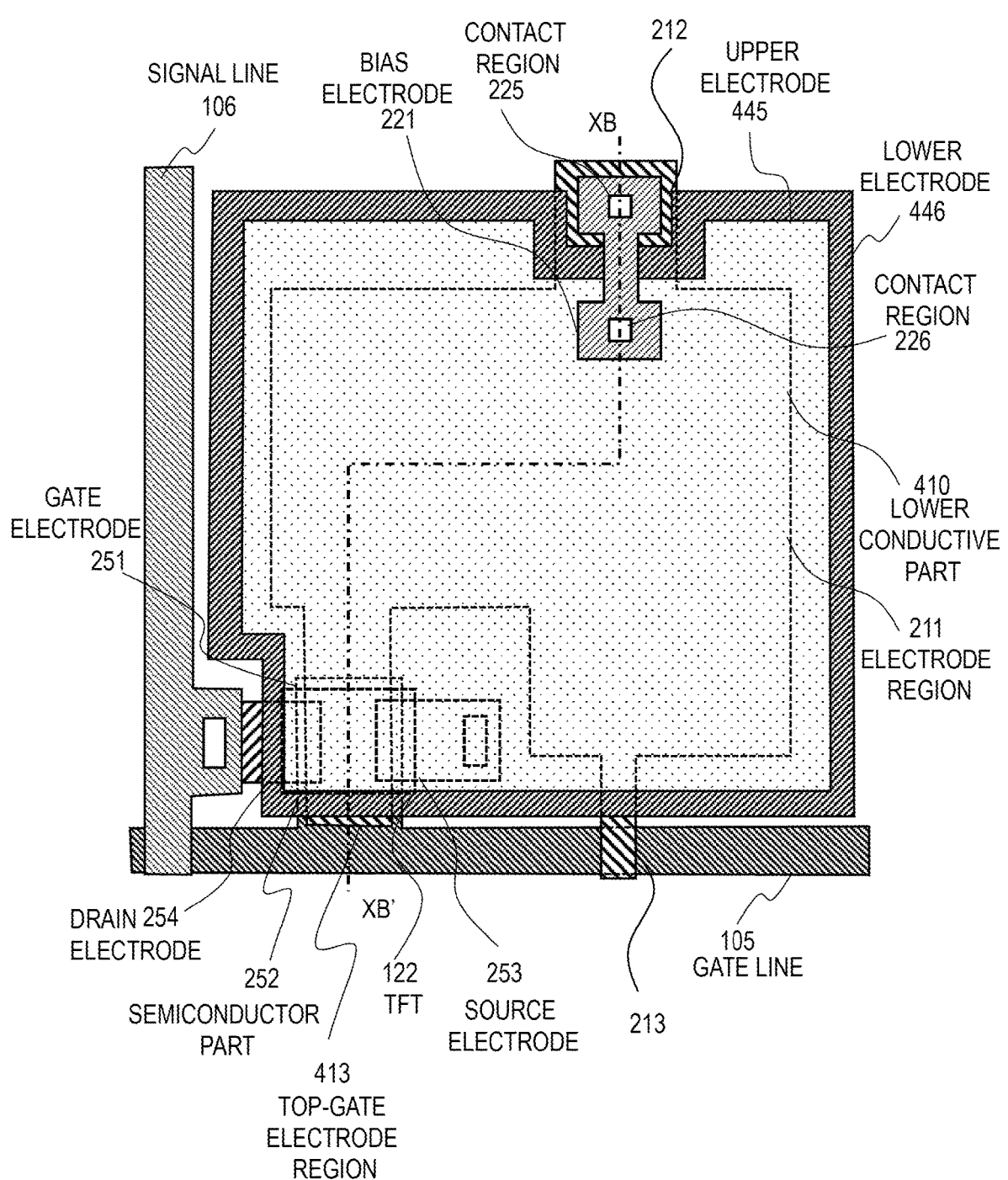
FIG. 10A is a plan diagram schematically illustrating still another example of the structure of a pixel, a gate line, and a signal line.
Figure 10B:
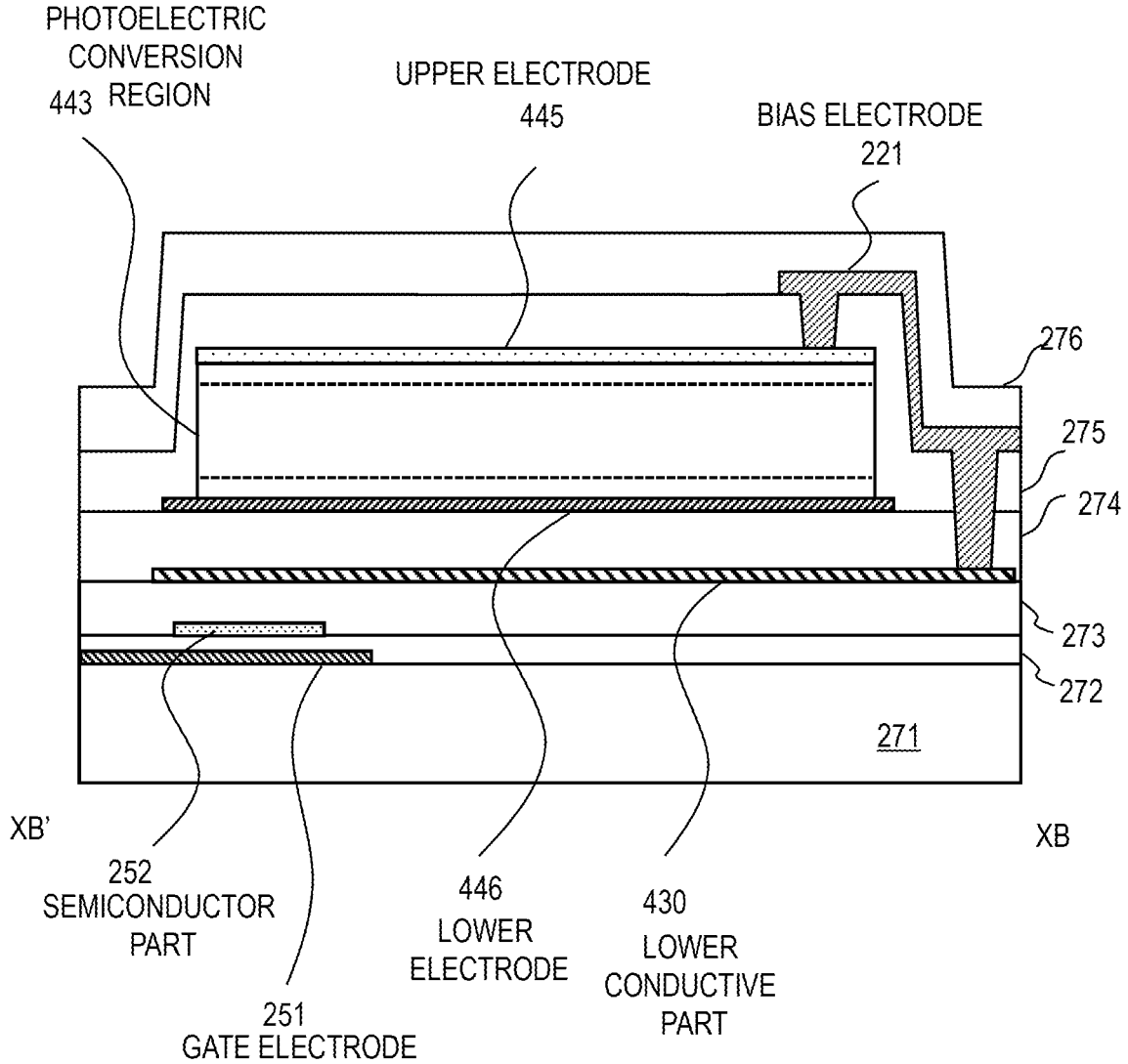
FIG. 10B is a cross-sectional diagram along the section line XB-XB' in FIG. 10A.

FIG. 10A is a plan diagram schematically illustrating still another structure of a pixel 13, a gate line 105, and a signal line 106. FIG. 10B is a cross-sectional diagram along the section line XB-XB' in FIG. 10A. The following mainly describes the differences from the configuration illustrated in FIGS. 7A and 7B. In this configuration example, the photodiode is provided to cover all or a part of the thin-film transistor when viewed planarly. A part of the photodiode is located directly above the thin-film transistor. This configuration increases the light-receiving area (aperture rate) of the photodiode.

As illustrated in FIG. 10A, the lower electrode 446 and the upper electrode 445 covers a part of the thin-film transistor 122. The semiconductor part 252 in this example is fully covered with the lower electrode 446 and the upper electrode 445. As illustrated in FIG. 10B, the photoelectric conversion region 443 also covers a part of the thin-film transistor 122. The photoelectric conversion region 443 in this example is a PIN silicon laminate and covers the same area as the upper electrode 445 when viewed planarly.

Figure 11A:
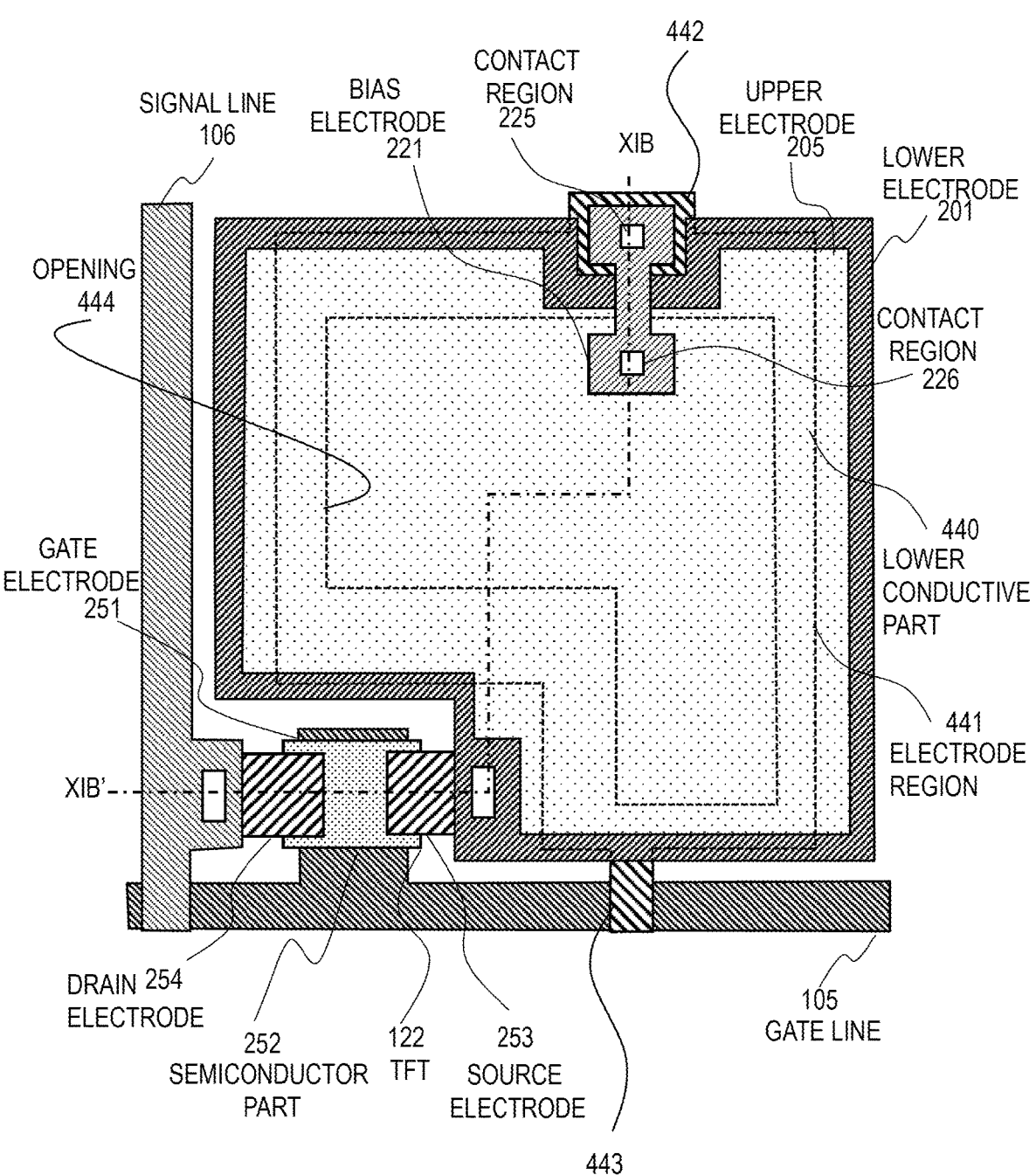
FIG. 11A is a plan diagram schematically illustrating still another example of the structure of a pixel, a gate line, and a signal line.
Figure 11B:
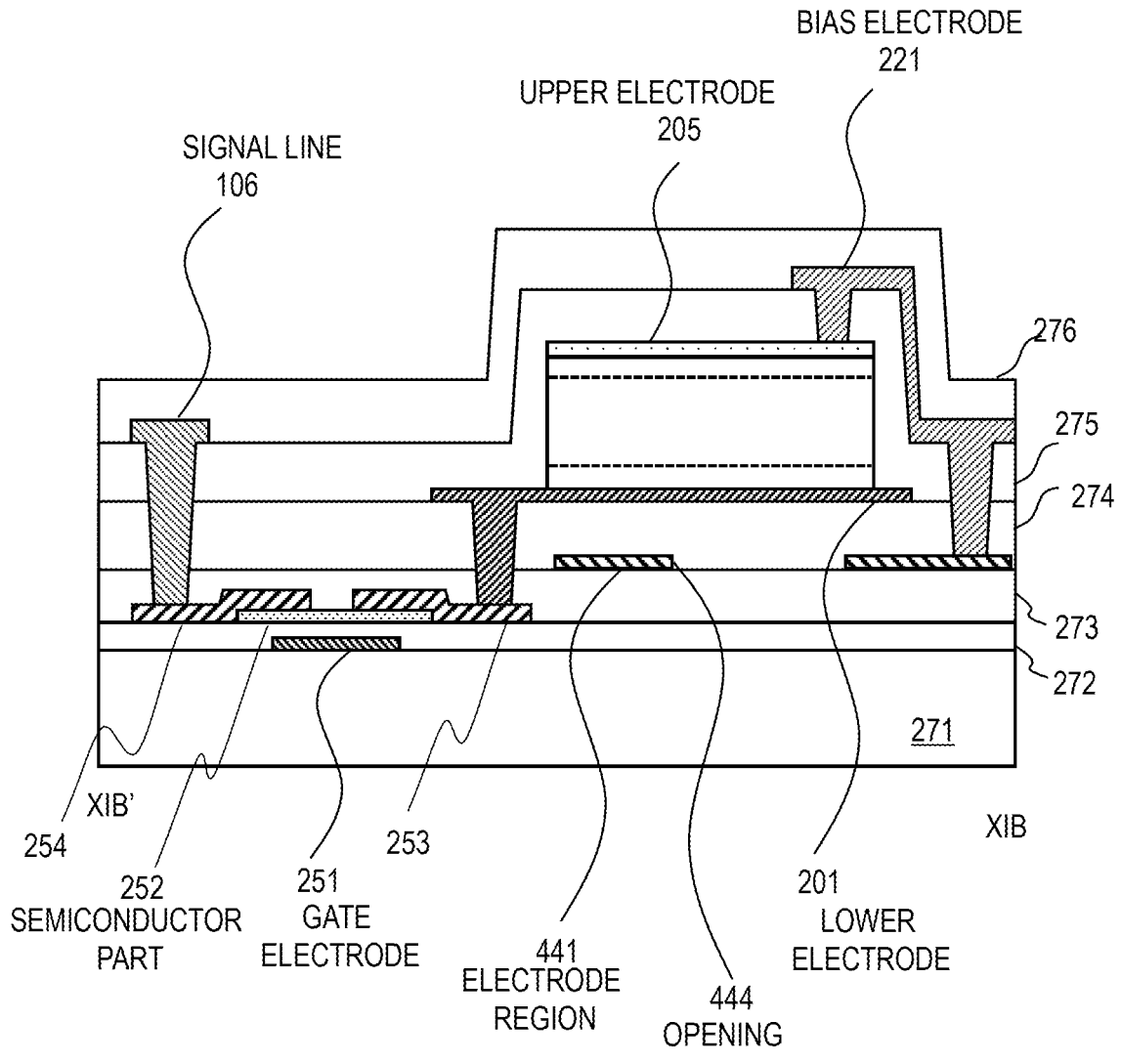
FIG. 11B is a cross-sectional diagram along the section line XIB-XIB' in FIG. 11A.

FIG. 11A is a plan diagram schematically illustrating still another structure of a pixel 13, a gate line 105, and a signal line 106. FIG. 11B is a cross-sectional diagram along the section line XIB-XIB' in FIG. 11A. The following mainly describes the differences from the configuration illustrated in FIGS. 3A to 3C.

In this configuration example, the lower conductive part 440 has an opening 444 in the electrode region 441. The opening 444 is provided in the area covered with the lower electrode 201 when viewed planarly. Accordingly, an additional capacitor having a desirable capacitance can be obtained by adjusting the size of the opening 444.

In the configuration example of FIG. 11A, the electrode region 441 is partially expanded to the outside of the upper electrode 205 when viewed planarly. The whole electrode region 441 is located within the area of the lower electrode 201 when viewed planarly. The lower conductive part 440 is connected with the lower conductive parts of the vertically adjacent pixels 13 through connector regions 442 and 443.

Figure 12A:
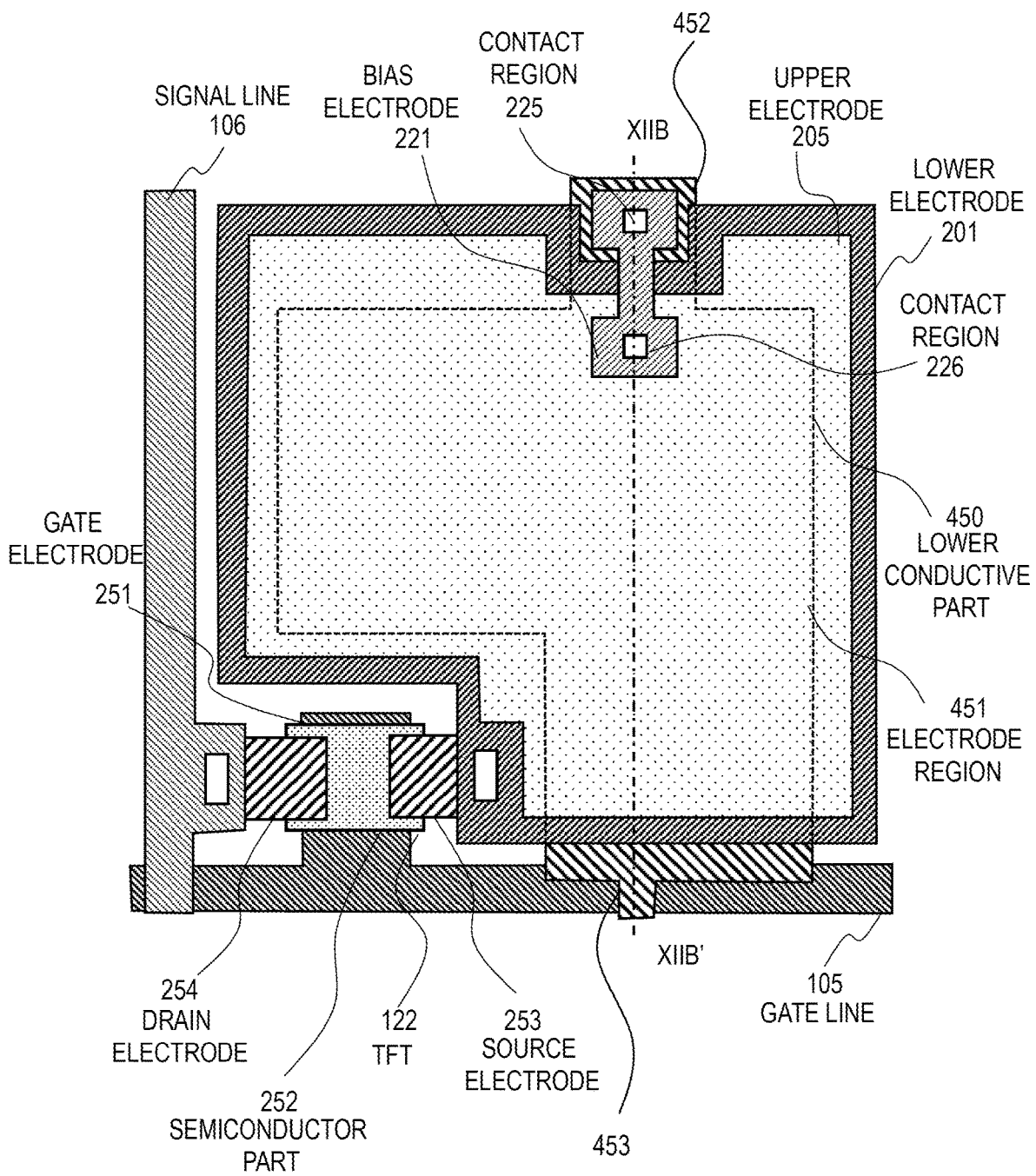
FIG. 12A is a plan diagram schematically illustrating still another example of the structure of a pixel, a gate line, and a signal line.
Figure 12B:
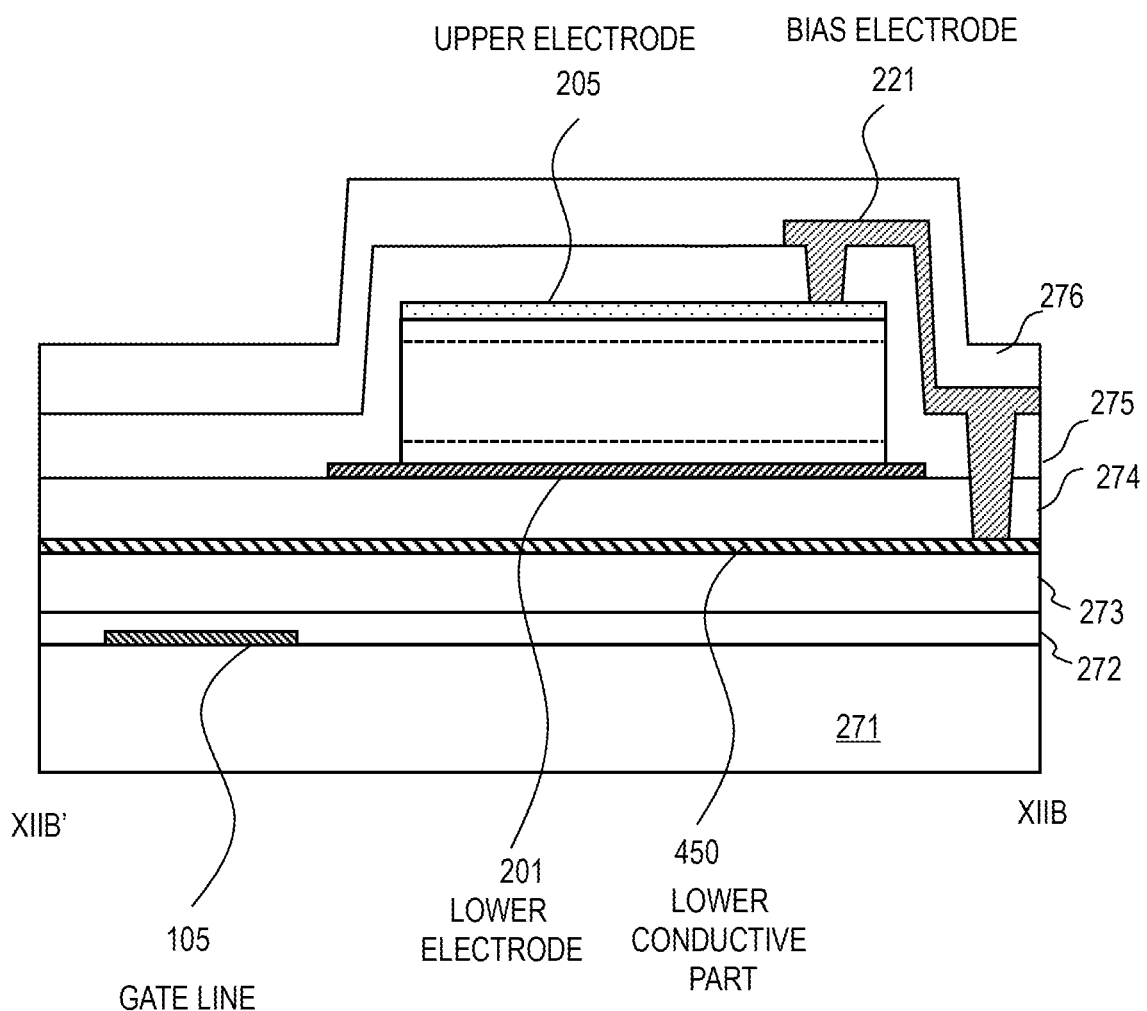
FIG. 12B is a cross-sectional diagram along the section line XIIB-XIIB' in FIG. 12A.

FIG. 12A is a plan diagram schematically illustrating still another structure of a pixel 13, a gate line 105, and a signal line 106. FIG. 12B is a cross-sectional diagram along the section line XIIB-XIIB' in FIG. 12A. The following mainly describes the differences from the configuration illustrated in FIGS. 3A to 3C.

In the configuration example of FIGS. 12A and 12B, the electrode region 451 of the lower conductive part 450 is partially expanded to the outside of the upper electrode 205 and the lower electrode 201 when viewed planarly. The part of the electrode region 451 outer than the lower electrode 201 partially overlaps the gate line 105. This configuration reduces the noise from the gate line more effectively.

Figure 13A:
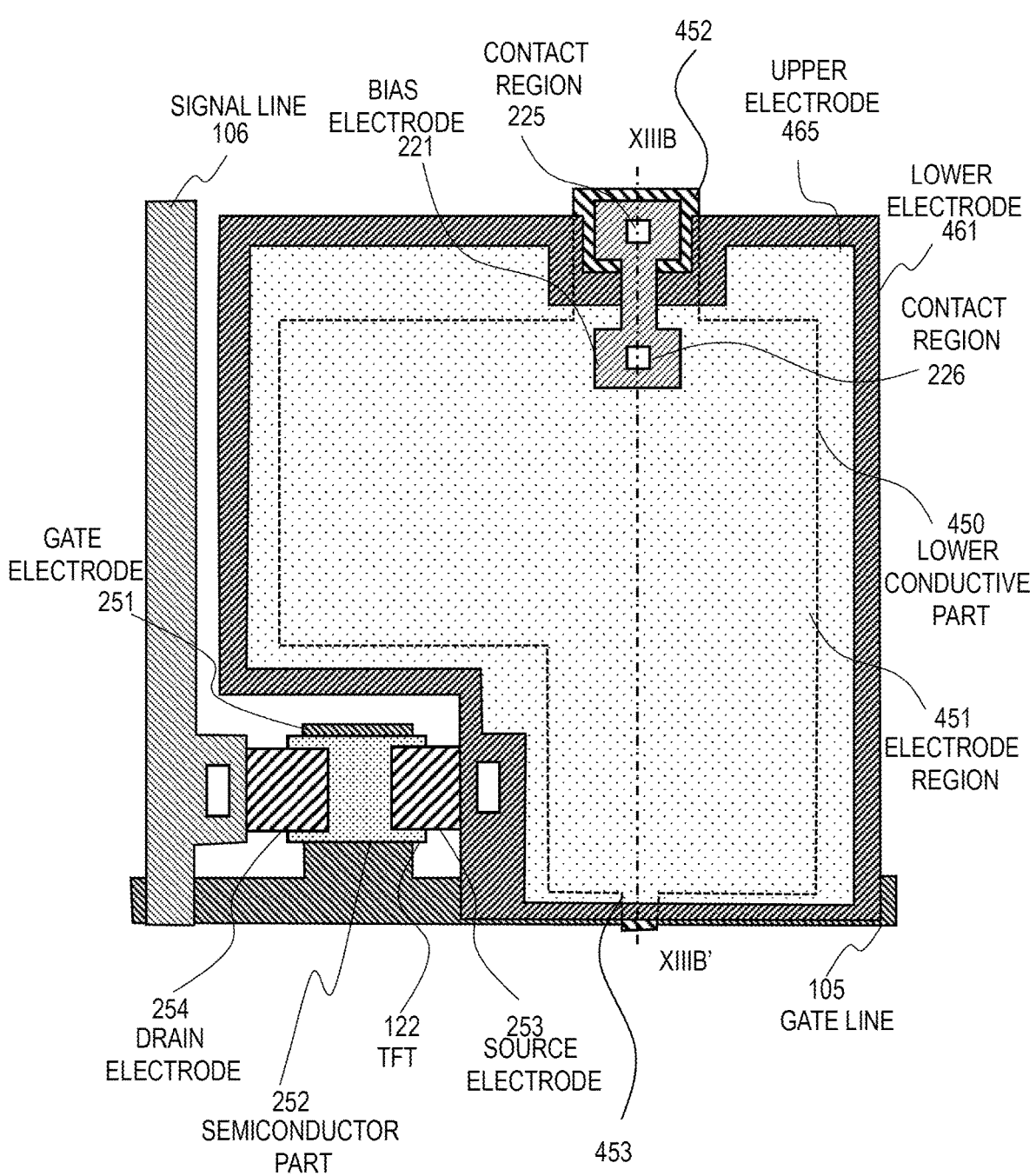
FIG. 13A is a plan diagram schematically illustrating still another example of the structure of a pixel, a gate line, and a signal line.
Figure 13B:
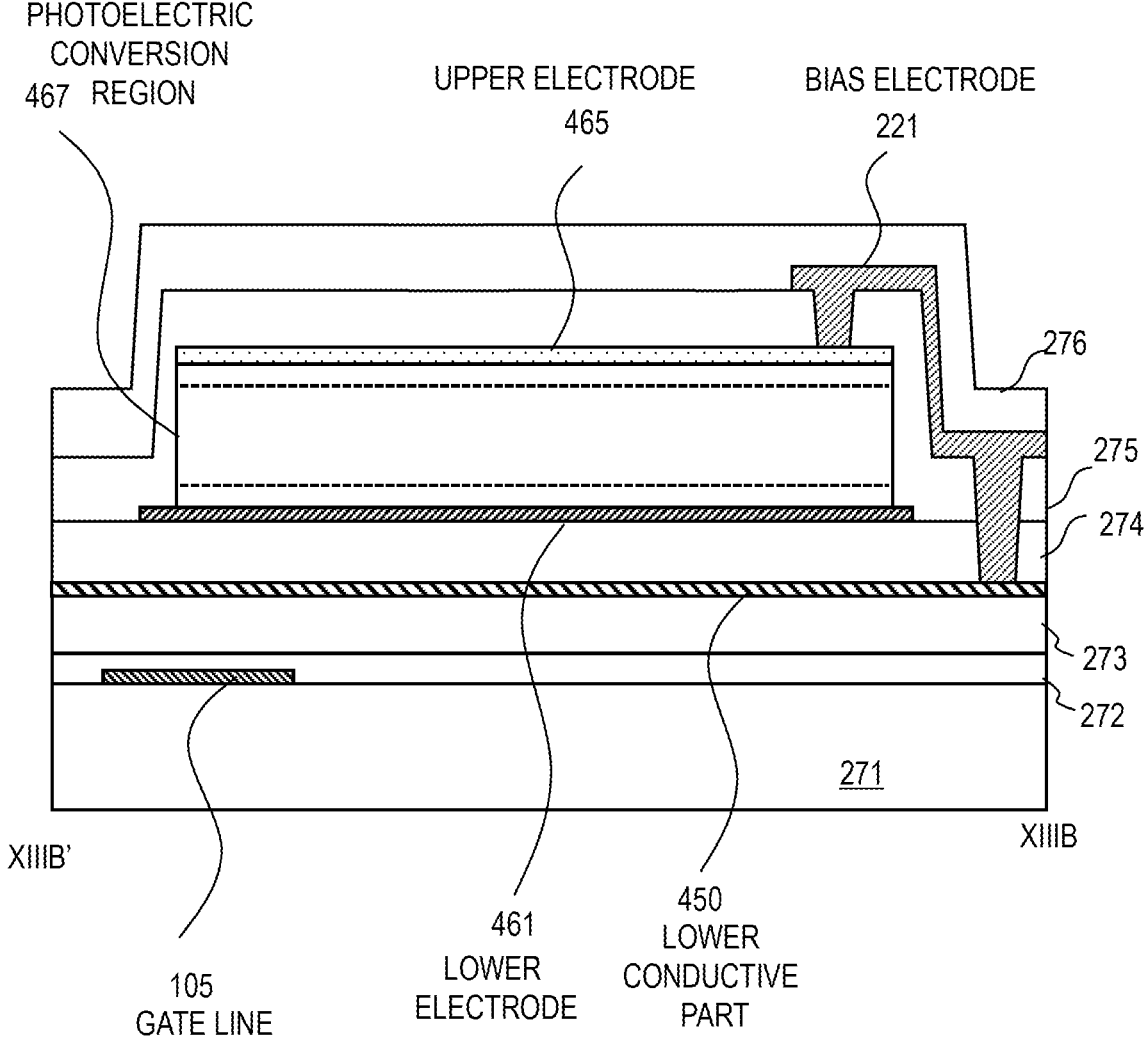
FIG. 13B is a cross-sectional diagram along the section line XIIIB-XIIIB' in FIG. 13A.

FIG. 13A is a plan diagram schematically illustrating still another structure of a pixel 13, a gate line 105, and a signal line 106. FIG. 13B is a cross-sectional diagram along the section line XIIIB-XIIIB' in FIG. 13A. The following mainly describes the differences from the configuration illustrated in FIGS. 12A and 12B.

A part of the lower electrode 461 is located directly above the gate line 105 with a part of the electrode region 451 of the lower conductive part 450 interposed therebetween. A part of the upper electrode 465 and a part of the photoelectric conversion region 467 are also located directly above the gate line 105 with a part of the lower electrode 461 interposed therebetween. The lower electrode 461, the upper electrode 465, and the photoelectric conversion region 467 extend to cover a part of the gate line 105 when viewed planarly. Accordingly, this configuration increases the light-receiving area (aperture rate) of the photoelectric conversion region more.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A photodiode array comprising a plurality of elemental devices arrayed on a substrate, each of the plurality of elemental devices including:
   an upper electrode;
   a lower electrode;
   a photoelectric conversion region between the upper electrode and the lower electrode;
   a lower conductive part located lower than the lower electrode;
   a first insulating layer between the lower electrode and the lower conductive part;
   a switch transistor configured to switch whether to electrically connect the elemental device to a signal line;
   a bias electrode;
   a first contact region overlapping a part of the switch transistor when viewed planarly and electrically connecting the bias electrode, wherein a part of the lower conductive part covers at least a part of a channel of the switch transistor when viewed planarly; and
   a second contact region configured to electrically connect the bias electrode and the upper electrode,
   wherein the switch transistor includes a source electrode and a drain electrode that are located lower than the lower electrode, and a gate electrode located lower than the source electrode and the drain electrode,
   wherein each of the plurality of elemental devices includes a second insulating layer between the lower conductive part and the source and drain electrodes,
   wherein the lower conductive part at least partially overlaps the lower electrode with the first insulating layer interposed therebetween when viewed planarly, and
   wherein the lower conductive part is electrically insulated from the lower electrode, the source electrode, and the drain electrode.

2. The photodiode array according to claim 1,
   wherein the plurality of elemental devices are laid out in a matrix, and
   wherein the lower conductive part is connected with other lower conductive parts horizontally and vertically adjacent to the lower conductive part.

3. The photodiode array according to claim 1,
   wherein each of the plurality of elemental devices further includes a switch transistor configured to switch whether to electrically connect the elemental device to a signal line, and
   wherein source/drain electrodes of the switch transistor and the lower conductive part are located on a same insulating layer and made of same material.

4. The photodiode array according to claim 1, wherein a part of the photoelectric conversion region covers at least a part of the channel when viewed planarly.

5. The photodiode array according to claim 1, wherein the lower conductive part has an opening in a region opposed to the lower electrode when viewed planarly.

6. The photodiode array according to claim 1, wherein a part of the lower conductive part covers at least a part of a gate line configured to transmit a signal to the gate electrode when viewed planarly.

7. The photodiode array according to claim 6, wherein a part of the photoelectric conversion region covers at least a part of the gate line when viewed planarly.

8. An image sensor comprising:
the photodiode array according to claim 1; and
a circuit configured to drive and control the photodiode array.

* * * * *